United States Patent
Kim et al.

(10) Patent No.: US 10,355,533 B2
(45) Date of Patent: Jul. 16, 2019

(54) WIRELESS POWER TRANSMISSION SYSTEM, AND METHOD FOR CONTROLLING WIRELESS POWER TRANSMISSION AND WIRELESS POWER RECEPTION

(71) Applicant: SAMSUNG ELECTRONICS CO., LTD., Suwon-si (KR)

(72) Inventors: Nam Yun Kim, Seoul (KR); Sang Wook Kwon, Seongnam-si (KR); Yun Kwon Park, Dongducheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/257,935

(22) Filed: Jan. 25, 2019

(65) Prior Publication Data

US 2019/0173321 A1  Jun. 6, 2019

Related U.S. Application Data

(63) Continuation of application No. 15/646,728, filed on Jul. 11, 2017, now Pat. No. 10,236,723, which is a
(Continued)

(30) Foreign Application Priority Data

Mar. 23, 2011 (KR) .................. 10-2011-0025739

(51) Int. Cl.
  *H02J 50/12* (2016.01)
  *H02J 50/40* (2016.01)
  (Continued)

(52) U.S. Cl.
  CPC ............. *H02J 50/12* (2016.02); *G01R 23/04* (2013.01); *G01R 27/04* (2013.01); *H02J 5/005* (2013.01);
  (Continued)

(58) Field of Classification Search
  CPC .. H02J 50/12; H02J 50/80; H02J 50/40; H02J 5/005; H02J 7/025; H02J 7/0027; H02J 7/0044; G01R 23/04; G01R 27/04
  See application file for complete search history.

(56) References Cited

U.S. PATENT DOCUMENTS 8,946,940 B2   2/2015  Kim et al.
2009/0140691 A1  6/2009  Jung
(Continued)

FOREIGN PATENT DOCUMENTS

CN   101375483 A   2/2009
CN   101860085 A   10/2010
(Continued)

OTHER PUBLICATIONS

International Search Report dated Sep. 27, 2012 in counterpart International Application No. PCT/KR2012/002073 (3 pages, in English).
(Continued)

*Primary Examiner* — Robert L Deberadinis
(74) *Attorney, Agent, or Firm* — Sughrue Mion, PLLC

(57) ABSTRACT

A wireless power transmission system, and a method for controlling wireless power transmission and wireless power reception are provided. According to an aspect, a method for controlling a wireless power transmission may include: detecting a plurality of target devices used to wirelessly receive power; selecting a source resonating unit from among a plurality of source resonating units, based on the amount of power to be transmitted to one or more of the plurality of target devices, a coupling factor associated with one or more of the plurality of target devices, or both; and wirelessly transmitting power to a target device using the selected source resonating unit.

19 Claims, 21 Drawing Sheets

Related U.S. Application Data continuation of application No. 14/597,503, filed on Jan. 15, 2015, now Pat. No. 9,729,013, which is a continuation of application No. 13/424,433, filed on Mar. 20, 2012, now Pat. No. 8,946,940.

(51) Int. Cl.
*H02J 50/90* (2016.01)
*H02J 7/02* (2016.01)
*H02J 50/80* (2016.01)
*G01R 23/04* (2006.01)
*G01R 27/04* (2006.01)
*H02J 5/00* (2016.01)
*H02J 7/00* (2006.01)

(52) U.S. Cl.
CPC .............. *H02J 7/025* (2013.01); *H02J 50/40* (2016.02); *H02J 50/80* (2016.02); *H02J 50/90* (2016.02); *H02J 7/0027* (2013.01); *H02J 7/0044* (2013.01)

(56) References Cited

U.S. PATENT DOCUMENTS

| | | |
|---|---|---|
| 2009/0212636 A1 | 8/2009 | Cook et al. |
| 2010/0033021 A1 | 2/2010 | Bennett |
| 2010/0194335 A1 | 8/2010 | Kirby et al. |
| 2010/0248622 A1 | 9/2010 | Lyell Kirby et al. |
| 2010/0259217 A1 | 10/2010 | Baarman et al. |
| 2012/0193997 A1 | 8/2012 | Hong et al. |

FOREIGN PATENT DOCUMENTS

| | | |
|---|---|---|
| CN | 101964551 A | 2/2011 |
| EP | 0 533 247 A1 | 3/1993 |
| JP | 2004-159456 A | 6/2004 |
| JP | 2010-063245 A | 3/2010 |
| JP | 2010-154592 A | 7/2010 |
| JP | 2010-158151 A | 7/2010 |
| JP | 2010-183813 A | 8/2010 |
| JP | 2010-239838 A | 10/2010 |
| KR | 10-1088401 B1 | 12/2011 |
| WO | 2009/014125 A1 | 1/2009 |
| WO | 2009/155030 A2 | 12/2009 |
| WO | 2010/026528 A2 | 3/2010 |
| WO | 2010/117665 A2 | 10/2010 |
| WO | 2011/005010 A2 | 1/2011 |

OTHER PUBLICATIONS

Chinese Office Action dated Jun. 30, 2014 in counterpart Chinese Application No. 201280014737.8 (7 pages in Chinese).

Extended European Search Report dated Sep. 17, 2015 in corresponding European Patent Application No. 12759952.0 (9 pages, in English).

Japanese Office Action issued in counterpart Japanese Application No. 2014-501005 dated Feb. 9, 2016 (17 pages with English translation).

Communication dated Mar. 4, 2019 issued by the State Intellectual Property Office of P.R. China in counterpart Chinese Application No. 201510497625.8.

$$\omega_{MZR} = \frac{1}{\sqrt{L_R C_L}}$$

WIRELESS POWER TRANSMISSION SYSTEM, AND METHOD FOR CONTROLLING WIRELESS POWER TRANSMISSION AND WIRELESS POWER RECEPTION

CROSS-REFERENCE TO RELATED APPLICATIONS

This application is a continuation of U.S. patent application Ser. No. 15/646,728, filed Jul. 11, 2017, which is a continuation of U.S. patent application Ser. No. 14/597,503, filed Jan. 15, 2015, now U.S. Pat. No. 9,729,013, which claims the benefit of U.S. patent application Ser. No. 13/424,433, filed Mar. 20, 2012, now U.S. Pat. No. 8,946,940, which claims the benefit under 35 U.S.C. 119(a) of a Korean Patent Application No. 10-2011-0025739, filed on Mar. 23, 2011, in the Korean Intellectual Property Office, the entire disclosures of which are incorporated herein by reference for all purposes.

BACKGROUND

1. Field

The following disclosure relates to wireless power transmission and reception.

2. Description of Related Art

Wireless power refers to type of energy that is transferred from a wireless power transmitter to a wireless power receiver. Accordingly, a typical wireless power transmission system includes a source device and a target device. The source device may wirelessly transmit power, and the target device may wirelessly receive power. The source device includes a source resonator, and the target device includes a target resonator. A magnetic coupling or resonance coupling may be formed between the source resonator and the target resonator.

Due to characteristics of a wireless environment, that distance between a source resonator and a target resonator may be highly likely to vary over time, and matching requirements to match the source resonator and the target resonator may also change. Thus, the power transmission efficiency may be reduced.

SUMMARY

According to one general aspect, a method for controlling a wireless power transmission may include: detecting a plurality of target devices used to wirelessly receive power; selecting a source resonating unit from among a plurality of source resonating units, based on the amount of power to be transmitted to one or more of the plurality of target devices, a coupling factor associated with one or more of the plurality of target devices, or both; and wirelessly transmitting power to a target device using the selected source resonating unit.

The detecting may include: broadcasting a wake-up request signal; and receiving one or more response signals in response to the wake-up request signal from one or more of the plurality of target devices, wherein one or more of the response signals comprises information on an identifier (ID) of a corresponding target device, information on the amount of power to be used in the corresponding target device, or both.

The detecting may include: broadcasting wake-up request signals using the plurality of source resonating units; and receiving response signals in response to the wake-up request signals from the plurality of target devices.

The selecting may include: selecting the source resonating unit transmitting the largest amount of power to one or more of the plurality of target devices from among the plurality of source resonating units.

The selecting may include: verifying a first power amount of power to be transmitted to a first target device adjacent to a first source resonating unit, and a second power amount of power to be transmitted to a second target device adjacent to a second source resonating unit; and selecting the first source resonating unit when the first power amount is greater by a predetermined value than the second power amount, and selecting the second source resonating unit when the second power amount is greater by the predetermined value than the first power amount.

A first target resonator of the first target device may be different in size or in the number of turns of a coil from a second target resonator of the second target device.

The selecting may include: selecting the source resonating unit having the highest coupling factor with respect to one or more of the plurality of target devices from among the plurality of source resonating units.

The selecting may include: verifying a first power amount of power to be transmitted to a first target device adjacent to a first source resonating unit, and a second power amount of power to be transmitted to a second target device adjacent to a second source resonating unit; verifying a coupling factor with respect to one or more of the first target device and the second target device, when a difference between the first power amount and the second power amount is less than or equal to a predetermined value; and selecting the source resonating unit having the higher coupling factor from among the first source resonating unit and the second source resonating unit.

The selecting may include: verifying a first power amount of power to be transmitted to a first target device adjacent to a first source resonating unit, and a second power amount of power to be transmitted to a second target device adjacent to a second source resonating unit; and turning on or off the first source resonating unit and the second source resonating unit, when a difference between the first power amount and the second power amount is less than or equal to a predetermined value.

The method may further include: turning off the selected source resonating unit when power reception of the target device adjacent to the selected source resonating unit is terminated; and turning on a source resonating unit adjacent to a low power device used to wirelessly receive power from the target resonator among the plurality of source resonating units.

The amount of power transmitted wirelessly from the selected source resonating unit to the target device adjacent to the selected source resonating unit is determined based on the amount of power to be used in the target device adjacent to the selected source resonating unit, the amount of power to be used in the low power device, or both.

The selecting may include: turning on the selected source resonating unit; and turning off one or more source resonating units other than the selected source resonating unit. According to another general aspect, a wireless power transmitter may include: a detector configured to detect a plurality of target devices used to wirelessly receive power; a controller configured to select a source resonating unit from among a plurality of source resonating units, based on the amount of power to be transmitted to one or more of the plurality of target devices, a coupling factor associated with one or more of the plurality of target devices, or both; and a power transmitting unit configured to wirelessly transmit power to a target device using the selected source resonating unit.

The detector may include: a communication unit configured to broadcast a wake-up request signal, and to receive response signals in response to the wake-up request signal from one or more of the plurality of target devices, wherein one or more of the response signals comprises information on an identifier (ID) of a corresponding target device, information on the amount of power to be used in the corresponding target device, or both.

The controller may select, from among the plurality of source resonating units, a source resonating unit transmitting the largest amount of power to one or more of the plurality of target devices, or a source resonating unit having the highest coupling factor with respect to one or more of the plurality of target devices.

The controller may include: a first processor configured to verify a first power amount of power to be transmitted to a first target device adjacent to a first source resonating unit, and a second power amount of power to be transmitted to a second target device adjacent to a second source resonating unit; and a second processor configured to select the first source resonating unit when the first power amount is greater by a predetermined value than the second power amount, to select the second source resonating unit when the second power amount is greater by the predetermined value than the first power amount, and to verify a coupling factor with respect to one or more of the first target device and the second target device and to select a source resonating unit having a high coupling factor from among the first source resonating unit and the second source resonating unit when the difference between the first power amount and the second power amount is less than or equal to the predetermined value.

The second processor may turn on or off the first source resonating unit and the second source resonating unit, when the difference between the first power amount and the second power amount is less than or equal to the predetermined value.

When power reception of the target device adjacent to the selected source resonating unit is terminated, the controller may turn off the selected source resonating unit, and turn on a source resonating unit adjacent to a low power device used to wirelessly receive power from the target resonator among the plurality of source resonating units.

The amount of power transmitted wirelessly from the selected source resonating unit to the target device adjacent to the selected source resonating unit may be determined based on the amount of power to be used in the target device adjacent to the selected source resonating unit, on the amount of power to be used in the low power device, or both.

When power reception of the low power device is terminated, the controller may control the amount of the power wirelessly transmitted from the selected source resonating unit to the target device, based on the amount of the power to be used in the target device, the amount of power received to the target device, or both.

The power transmitting unit may include the plurality of source resonating units, wherein one or more of the plurality of source resonating units comprises a plurality of resonators arranged in an array.

The plurality of source resonating units may be identified by IDs of the plurality of source resonating units, wherein the controller recognizes locations of the plurality of target devices using the IDs.

According to yet another general aspect, a wireless power receiver may include: a communication unit configured to transmit, to a wireless power transmitter, information on an identifier (ID) of the wireless power receiver, information on the amount of power to be used in the wireless power receiver, or both; a power receiving unit configured to wirelessly receive power from a source resonating unit, to wirelessly receive power from a target resonator of another wireless power receiver, or both; and a controller configured to disconnect a load when power reception is terminated.

The power receiving unit wirelessly may receive the power from the source resonating unit when the amount of the power to be used in the wireless power receiver is greater than the amount of power to be used in the other wireless power receiver, wherein the power receiving unit wirelessly receives the power from the target resonator when the amount of the power to be used in the wireless power receiver is less than the amount of the power to be used in the other wireless power receiver.

The power receiving unit may include a target resonator, wherein the target resonator of the power receiving unit is different in size or in the number of turns of a coil from the target resonator of the other wireless power receiver.

Other features and aspects will be apparent from the following detailed description, the drawings, and the claims.

Figure 1:
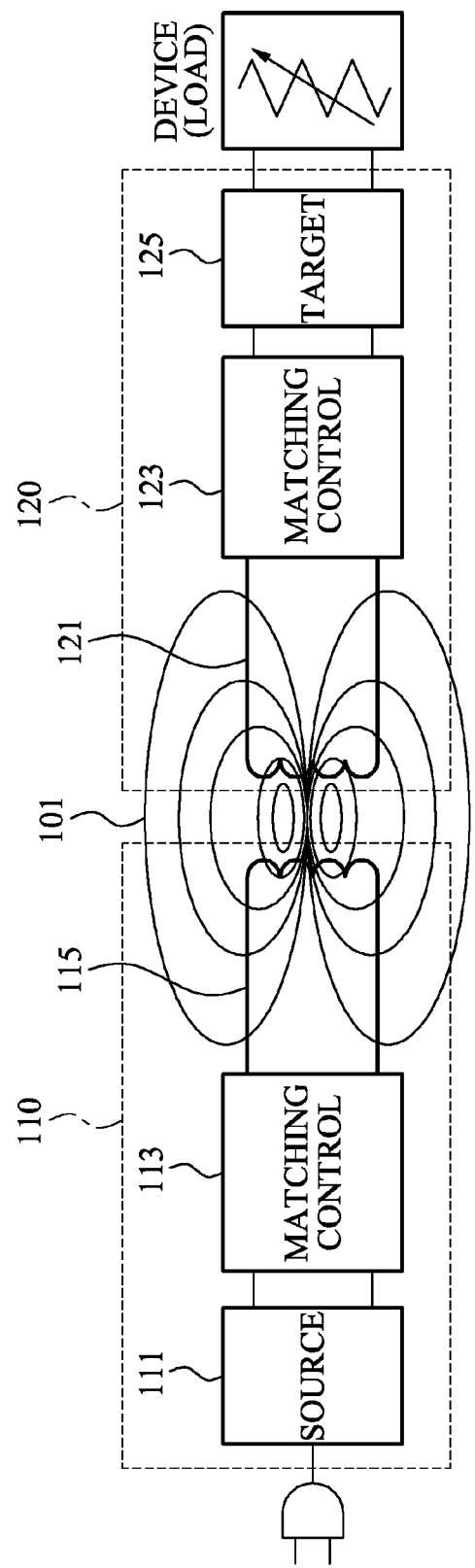
FIG. 1 is a diagram illustrating a wireless power transmission system.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art.

The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

FIG. 1 illustrates a wireless power transmission system. As shown, a source device 110 may include a source unit 111 and a source resonator 115. The source unit 111 may receive energy from an external voltage supply to generate power. The source device 110 may further include a matching control 113 to perform resonance frequency matching and/or impedance matching.

For example, the source unit 111 may include an alternating current (AC)-to-AC (AC/AC) converter, an AC-to-direct current (DC) (AC/DC) converter, and a DC-to-AC (DC/AC) inverter. The AC/AC converter may adjust, to a desired level, the signal level of an AC signal input from an external device. The AC/DC converter may output DC voltage at a predetermined level by rectifying an AC signal output from the AC/AC converter. The DC/AC inverter may generate an AC signal (e.g., in a band of a few megahertz (MHz) to tens of MHz) by quickly switching the DC voltage output from the AC/DC converter.

The matching control 113 may be configured to set at least one or both of a resonance bandwidth of the source resonator 115 and an impedance matching frequency of the source resonator 115. In some embodiments, the matching control 113 may include at least one of a source resonance bandwidth setting unit and a source matching frequency setting unit. The source resonance bandwidth setting unit may set the resonance bandwidth of the source resonator 115. The source matching frequency setting unit may be configured to set the impedance matching frequency of the source resonator 115. For example, a Q-factor of the source resonator 115 may be determined based on a setting of the resonance bandwidth of the source resonator 115 or a setting of the impedance matching frequency of the source resonator 115.

The source resonator 115 may transfer electromagnetic energy to a target resonator 121. For example, the source resonator 115 may transfer power to the target device 120 through magnetic coupling 101 with the target resonator 121. The source resonator 115 may resonate within the set resonance bandwidth.

The target device 120 includes the target resonator 121, a matching control 123 to perform resonance frequency matching or impedance matching, and a target unit 125 to transfer the received resonance power to a device or load.

The target resonator 121 may receive the electromagnetic energy from the source resonator 115. The target resonator 121 may resonate within the set resonance bandwidth.

For example, the matching control 123 may set at least one of a resonance bandwidth of the target resonator 121 and an impedance matching frequency of the target resonator 121. In some instances, the matching control 123 may include at least one of a target resonance bandwidth setting unit and a target matching frequency setting unit. The target resonance bandwidth setting unit may set the resonance bandwidth of the target resonator 121. The target matching frequency setting unit may set the impedance matching frequency of the target resonator 121. For example, a Q-factor of the target resonator 121 may be determined based on a setting of the resonance bandwidth of the target resonator 121 and/or a setting of the impedance matching frequency of the target resonator 121.

The target unit 125 may transfer the received power to the load. For example, the target unit 125 may include an AC/DC converter and a DC-to-DC (DC/DC) converter. The AC/DC converter may generate a DC signal by rectifying an AC signal transmitted from the source resonator 115 to the target resonator 121. The DC/DC converter may supply a predetermined or rated voltage to a device or the load by adjusting a signal level of the DC signal.

For example, the source resonator 115 and the target resonator 121 may be configured in a helix coil structured resonator, a spiral coil structured resonator, a meta-structured resonator, and the like.

Due to external effects, such as, for example, a change in a distance between the source resonator 115 and the target resonator 121, a change in a location of at least one of the source resonator 115 and the target resonator 121, and the like, an impedance mismatching between the source resonator 115 and the target resonator 121 may occur. The impedance mismatching may be a cause in decreasing an efficiency of power transfer. Thus, when a reflected wave corresponding to a transmission signal that is partially reflected by a target and returned is detected, the matching control 113 may determine the impedance mismatching has occurred, and may perform impedance matching. The matching control 113 may change a resonance frequency by detecting a resonance point through waveform analysis of the reflected wave. For example, the matching control 113 may determine a frequency that generates the minimum amplitude in the waveform of the reflected wave, as the resonance frequency.

Figure 2:
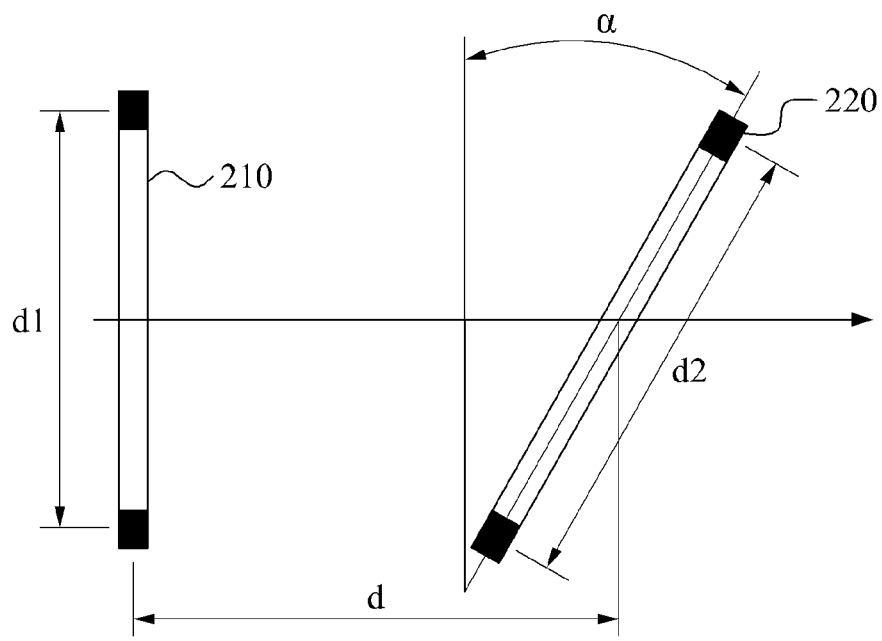
FIG. 2 is a diagram illustrating computing a coupling factor in a wireless power transmission system.

FIG. 2 illustrates computing a coupling factor in a wireless power transmission system having a source resonator 210 and a target resonator 220 spaced apart by a distance d. The source resonator 210 may have a length d1, and the target resonator 220 may have a length d2 and rotated by an angle α measured clockwise from normal/vertical. A coupling factor "K" between the source resonator 210 and the target resonator 220 may be calculated using Equation 1, as follows.

$$K = \frac{W_1^2 \times W_2^2 \times \cos(\alpha)}{\sqrt{W_1 \times W_2} \times (W_1^2 + d^2)^{\frac{3}{2}}}$$ [Equation 1]

In Equation 1, $W_1$ denotes the resonance frequency of the source resonator 210, $W_2$ denotes the resonance frequency of the target resonator 220. When $W_1$ is equal to $W_2$ in Equation 1, the coupling factor "K" may be maximized. Additionally, when has a value close to "0," the coupling factor "K" may have a high value.

In one or more embodiments, the length d1 of the source resonator 210 may be set to "$2 \times W_1$," and the length d2 of the target resonator 220 may be set to "$2 \times W_2$."

FIGS. 3 through 7 illustrate charging multiple targets according to various charging scenarios.

Figure 3:
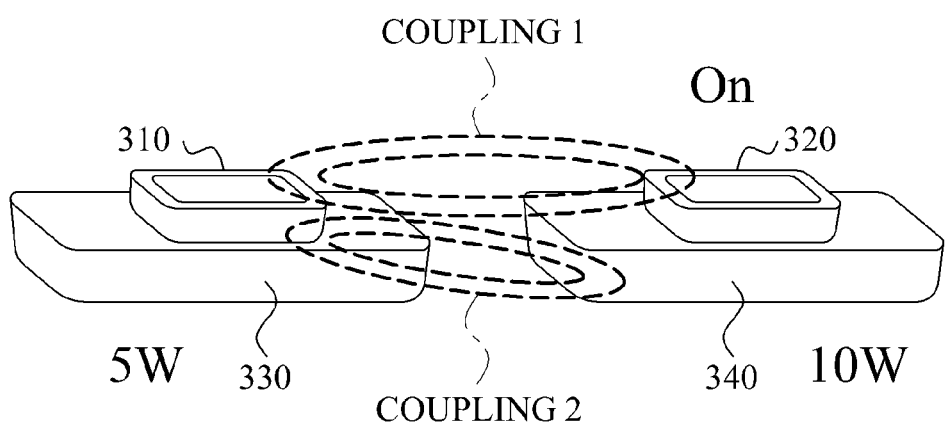
FIGS. 3 through 7 are diagrams illustrating charging multiple targets.

In FIG. 3, power may be simultaneously transmitted to different kinds of loads. A target device 310 may be located adjacent to a source resonating unit 330, and a target device 320 may be located adjacent to a source resonating unit 340. If the source resonating units 330 and 340 are in the form of pads, the target devices 310 and 320 may be placed on the source resonating units 330 and 340, respectively.

In FIG. 3, the target device 310 may require power of 5 Watt (W), and the target device 320 may require power of 10 W. Thus, a wireless power transmitter may transmit the power of 5 W to the target device 310, and may transmit the power of 10 W to the target device 320. In some instances, the target device 310 may be a low power device or a low power load. "Low power" as used herein may refer to a power requirement less than 10 W. On the other hand, the target device 320 may be a high power device or a high power load for instance. "High power" as used herein may refer to a power requirement greater than or equal to 10 W. Accordingly, loads or target devices may be classified based on the amount of power required by one or more of the target devices.

Figure 8:
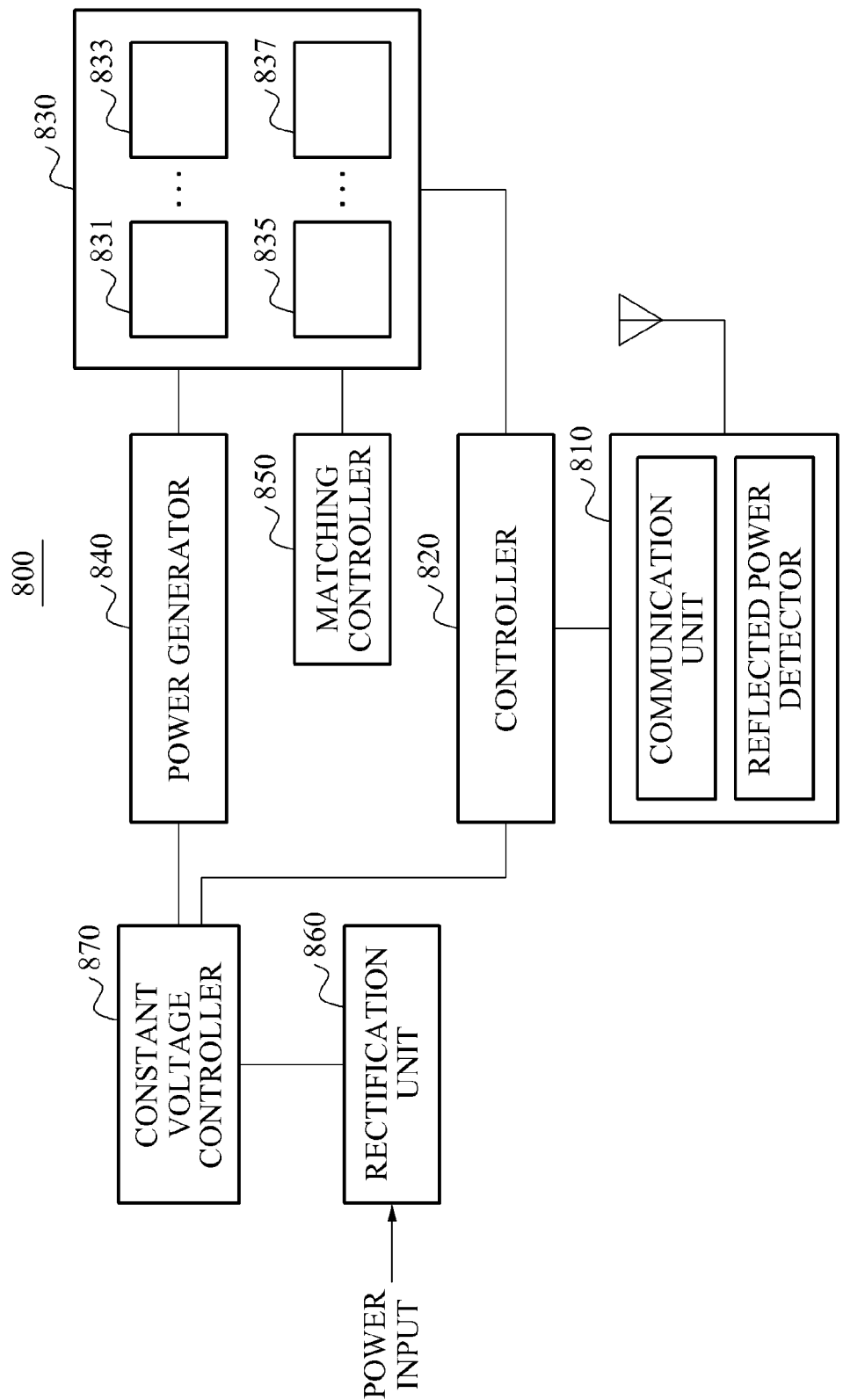
FIG. 8 is a diagram illustrating one configuration of a wireless power transmitter.

In FIG. 3, the source resonating unit 330 and the source resonating unit 340 may be included in the wireless power transmitter. FIG. 8 shows one configuration of the wireless power transmitter which will be further described below. According to one or more embodiments, when power is simultaneously transmitted to the low power device and the high power device, the wireless power transmitter may turn ON the source resonating unit 340 adjacent to the high power device, and may turn OFF the source resonating unit 330 adjacent to the low power device. In FIG. 3, the target device 320 may wirelessly receive power from the source resonating unit 340, and the target device 310 may receive the power from the target device 320. Accordingly, the target device 310 may receive the power from the target device 320 via magnetic coupling 1. Additionally, the target device 310 may receive power from the source resonating unit 340 via magnetic coupling 2.

A first target resonator of the target device 310 may be different in size or in the number of turns of a coil from a second target resonator of the target device 320. For example, the first target resonator of the target device 310 may have a size larger than 1.1 to 2 times the size of the second target resonator of the target device 320.

Figure 4:
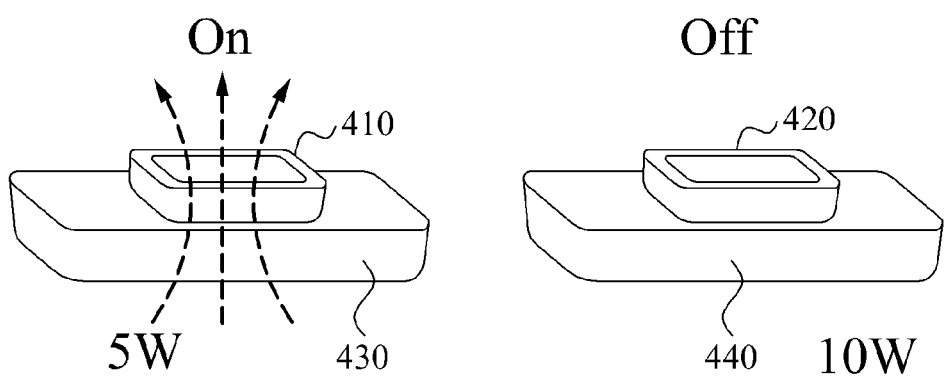

FIG. 4 illustrates when power reception of a high power device is terminated.

Referring to FIG. 4, a target device 410 may be located adjacent to a source resonating unit 430, and a target device 420 may be located adjacent to a source resonating unit 440. When the source resonating units 430 and 440 are in the form of pads, the target devices 410 and 420 may be placed on the source resonating units 430 and 440, respectively. Although it should be appreciated that the target devices could be placed next to (or in the general vicinity of) the source resonating units, in some instances.

As shown in FIG. 4, when power reception of the target device 420 (e.g., a high power device) is terminated, the source resonating unit 440 may be turned OFF, and the source resonating unit 430 may be turned ON. Accordingly, the target device 410 may receive power from the source resonating unit 430. The terminating of the power reception of the target device 420 may indicate, for example, that the target device 420 has completely received 10 W of power from the source resonating unit 440. A wireless power transmitter may detect a reflected wave, and/or receive a message from the target device 420 in order to determine that the power reception of the target device 420 has been terminated.

Figure 5:
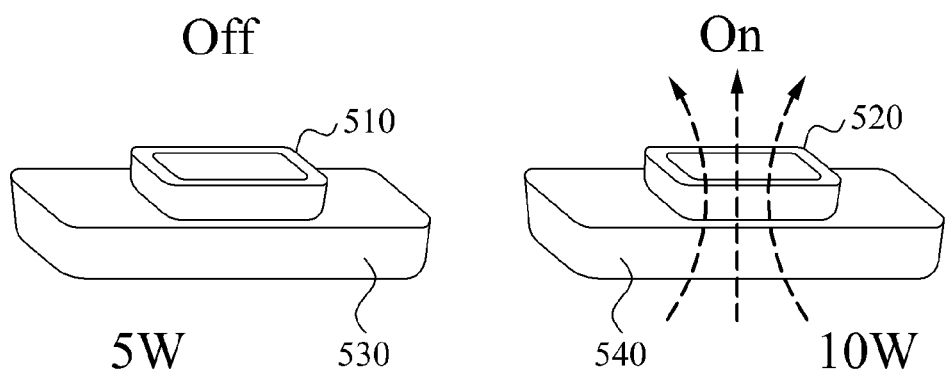

FIG. 5 illustrates when power reception of a low power device is terminated.

Referring to FIG. 5, a target device 510 may be located adjacent to a source resonating unit 530, and a target device 520 may be located adjacent to a source resonating unit 540. When the source resonating units 530 and 540 are in the form of pads, the target devices 510 and 520 may be placed on the source resonating units 530 and 540, respectively. Although it should be appreciated that the target devices could be placed next to (or in the general vicinity of) the source resonating units, in some instances.

In FIG. 5, when power reception of the target device 510 (e.g., a low power device) is terminated, the target device 510 may disconnect a load. And when the load is disconnected, a magnetic field between the target device 510 and the target device 520 may not be formed.

Figure 6:
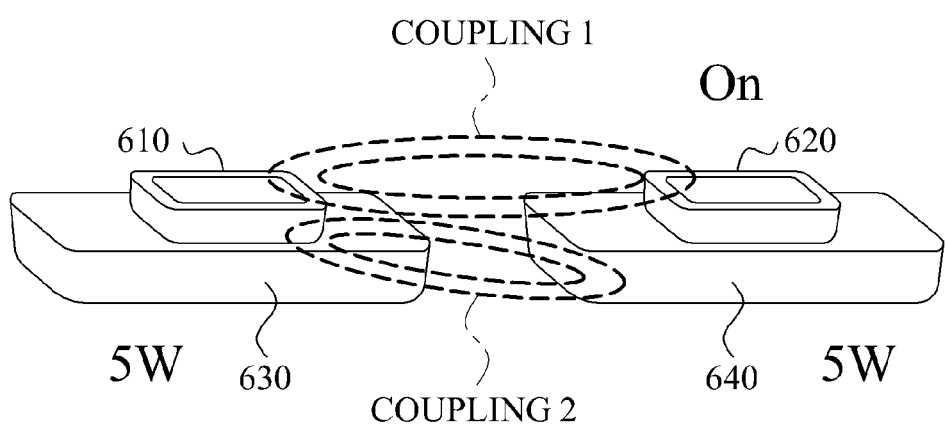

FIG. 6 illustrates simultaneously transmitting power to the same kind of load.

Referring to FIG. 6, a target device 610 may be located adjacent to a source resonating unit 630, and a target device 620 may be located adjacent to a source resonating unit 640. When the source resonating units 630 and 640 are in the form of pads, the target devices 610 and 620 may be placed on the source resonating units 630 and 640, respectively. Although it should be appreciated that the target devices could be placed next to (or in the general vicinity of) the source resonating units, in some instances.

In FIG. 6, both the target device 610 and the target device 620 are referred to as low power devices. However, in other instances, both the target device 610 and the target device 620 may be high power devices. In an embodiment, when a difference between a power amount P1 of power to be transmitted to the target device 610 and a power amount P2 of power to be transmitted to the target device 620 is within a predetermined range, the target devices 610 and 620 may be classified as the same kind of load. For example, when the difference between the power amounts P1 and P2 is less than or equal to 2 W, the target devices 610 and 620 may be classified as the same kind of load.

When loads are of the same kind, the coupling factor, or the power transmission efficiency may be considered. A wireless power transmitter may be configured to verify a coupling factor with respect to each of the target devices 610 and 620, and may select a source resonating unit having the higher coupling factor from among the source resonating units 610 and 620. Accordingly, the selected source resonating unit having the higher coupling factor may be turned ON, and the other source resonating unit having the lower coupling factor may be turned OFF.

In FIG. 6, the coupling factor between the target device 620 and the source resonating unit 640 may be greater than the coupling factor between the target device 610 and the source resonating unit 630. Accordingly, the source resonating unit 640 may be turned ON, and the source resonating unit 630 may be turned OFF. As illustrated in FIG. 6, the target device 610 may receive power from the target device 620 via magnetic coupling 1. Additionally, the target device 610 may also receive power from the source resonating unit 640 via magnetic coupling 2. The wireless power transmitter may determine the power transmission efficiency of one or more of the target devices 610 and 620, by measuring a reflected power, or by receiving information on the power transmission efficiency from each of the target devices 610 and 620. Additionally, the wireless power transmitter may select a source resonating unit having higher power transmission efficiency from among the source resonating units 630 and 640.

Figure 7:
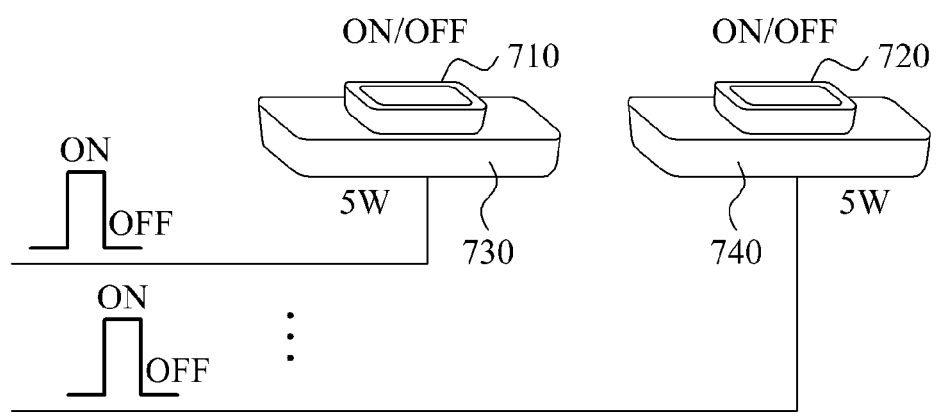

FIG. 7 illustrates transmitting power to the same kind of load in sequence.

Referring to FIG. 7, a target device 710 may be located adjacent to a source resonating unit 730, and a target device 720 may be located adjacent to a source resonating unit 740. The source resonating units 730 and 740 are in the form of pads, the target devices 710 and 720 may be placed on the source resonating units 730 and 740, respectively. Although it should be appreciated that the target devices could be placed next to (or in the general vicinity of) the source resonating units, in some instances. The source resonating units 730 and 740 may be alternately turned ON or OFF, to transmit the same amount of power to the target devices 710 and 720.

FIG. 8 illustrates one configuration of a wireless power transmitter.

As shown, a wireless power transmitter 800 may include a detector 810, a controller 820, and a power transmitting unit 830. Additionally, the wireless power transmitter 800 may further include a power generator 840, a matching controller 850, a rectification unit 860, and a constant voltage controller 870.

The detector 810 may be configured to detect a plurality of target devices that wirelessly receive power. The detector 810 may include a communication unit to broadcast a wake-up request signal, and to receive response signals in response to the wake-up request signal from each of the plurality of target devices. Additionally, the detector 810 may further include a reflected power detector to detect reflected power. One or more of the response signals may include information on an identifier (ID) of a corresponding target device, and information on the amount of power to be used in the corresponding target device.

The detector 810 may also receive location information of each of the plurality of target devices from the plurality of target devices. The location information may be ID information of each of a plurality of source resonating units 831, 833, 835, and 837. For example, a first target device adjacent to the source resonating unit 831 may receive an ID Si of the source resonating unit 831 from the source resonating unit 831, and may transmit, to the detector 810, a response signal including the received ID Si in response to the wake-up request signal. If the source resonating unit 831 is in the form of a pad, the first target device may be placed on the source resonating unit 831. For example, when two target devices are placed on the source resonating unit 831, the amount of power to be used in a corresponding target device may be obtained by adding amounts of powers to be used in the two target devices.

The power transmitting unit 830 may include the plurality of source resonating units 831, 833, 835, and 837. One or more of the plurality of source resonating units 831, 833, 835, and 837 may include a plurality of resonators arranged in an array. Here, a target device adjacent to the source resonating unit 831 will be referred to as a first target device, and a target device adjacent to the source resonating unit 833 will be referred to as a second target device.

The controller 820 may select a source resonating unit from among the plurality of source resonating units 831, 833, 835, and 837, based on the amount of power to be transmitted to each of the plurality of target devices, or based on a coupling factor associated with each of the plurality of target devices. One or more of the plurality of source resonating units 831, 833, 835, and 837 may be positioned adjacent to the plurality of target devices. Additionally, under the control of the controller 820, the power transmitting unit 830 may wirelessly transmit power to a target device adjacent to the selected source resonating unit, for instance, through a magnetic coupling between the selected source resonating unit and a target resonator of the target device adjacent to the selected source resonating unit.

The controller 820 may be configured to select, from among the plurality of source resonating units 831, 833, 835, and 837, a source resonating unit that transmits a large amount of power to one or more of the plurality of target devices, or a source resonating unit having a high coupling factor with respect to each of the plurality of target devices. The controller 820 may turn ON the selected source resonating unit, and may turn OFF source resonating units other than the selected source resonating unit.

In some instances, the controller 820 may include a first processor and a second processor. The first processor may be configured to verify a power amount P1 of power to be transmitted to the first target device, and a power amount P2 of power to be transmitted to the second target device. When the power amount P1 is greater by a predetermined value than the power amount P2, the second processor may select the source resonating unit 831. The predetermined value may be set to various values, for example, values in a range of 1 to 200 W. Additionally, when the power amount P2 is greater by the predetermined value than the power amount P1, the second processor may select the source resonating unit 833. In FIGS. 3 through 5, the predetermined value may be set to 4 W, and a difference between the power amounts P1 and P2 may be greater than 4 W. Additionally, when the difference between the power amounts P1 and P2 is less than or equal to the predetermined value, the second processor may verify a coupling factor with respect to each of the first target device and the second target device, and may select a source resonating unit having a high coupling factor from both the source resonating units 831 and 833. In FIGS. 6 and 7, the predetermined value may be set to 1 W, and the difference between the power amounts P1 and P2 may be less than 1 W. Accordingly, when the difference between the power amounts P1 and P2 is less than or equal to the predetermined value, the second processor may alternately turn ON or OFF the source resonating units 831 and 833, as illustrated in FIG. 7.

When power reception of the first target device is terminated, the controller 820 may turn OFF the selected source resonating unit 831, and may turn ON the source resonating unit 833 among the source resonating units 833, 835, and 837. The source resonating unit 833 may be located adjacent to a low power device that wirelessly receives power from the target resonator through magnetic coupling. For example, as illustrated in FIG. 4, the controller 820 may turn OFF the selected source resonating unit 440, and may turn ON the source resonating unit 430 adjacent to the target device 410, for instance, the low power device. The source resonating units 440 and 430 of FIG. 4 may be the source resonating units 831 and 833 of FIG. 8, respectively, in some embodiments.

The controller 820 may control the power generator 840, and may control the amount of power transmitted through each of the source resonating units 831, 833, 835, and 837. Accordingly, the controller 820 may determine the amount of power that is wirelessly transmitted from the selected source resonating unit 831 to the first target device, based on an amount "PHIGH" of power to be used in the first target device, and based on an amount "PLOW" of power to be used in the low power device. The first target device and the second target device may be a high power device and a low power device, respectively, in some embodiments.

As illustrated in FIG. 3, under the control of the controller 820, the power generator 840 may generate power, based on the amount of power transmitted through magnetic coupling from the target device 320 to the target device 310. As the difference between the amounts "PHIGH" and "PLOW" increases, the magnetic coupling between the first target device and the second target device may be better formed. Accordingly, in a situation when there is an extremely large difference between the amounts "PHIGH" and "PLOW," for example, when the difference is greater than or equal to than 10 W, the power transmission efficiency may be higher than when there is a small difference between the amounts "PHIGH" and "PLOW," for example, the difference being less than or equal to than 5 W.

When power reception of the low power device is terminated, the controller 820 may control the amount of power that is wirelessly transmitted to the second target device, based on the amount of the power to be used in the first target device, the amount of power received to the first target device, or both.

The power generator 840 may generate power to be transmitted to a wireless power receiver. The power generator 840 may generate power under the control of the controller 820. And the power generator 840 may convert a DC current of a predetermined level to an AC current by a switching pulse signal (e.g., in a band of a few MHz to tens of MHz), and may generate power. Accordingly, the power generator 840 may include an AC/DC inverter. The DC current may be provided from the constant voltage controller 870. The AC/DC inverter may include a switching device for high-speed switching. When the switching pulse signal is "high" (i.e., at or near its maximum), the switching device may be powered ON. When the switching pulse signal is "low" (i.e., at or near its minimum), the switching device may be powered OFF. The matching controller 850 may perform impedance matching between the power transmitting unit 830 and the power generator 840. For example, the matching controller 850 may adjust impedances of one or more of the plurality of source resonating units 831, 833, 835, and 837 under the control of the controller 820.

The rectification unit 860 may generate a DC voltage by rectifying an AC voltage, for example, in a band of tens of Hz.

The constant voltage controller 870 may receive the DC voltage from the rectification unit 860, and may output a DC voltage at a predetermined level under the control of the controller 820. The constant voltage controller 870 may include a stabilization circuit configured to output the DC voltage at the predetermined level.

Figure 9:
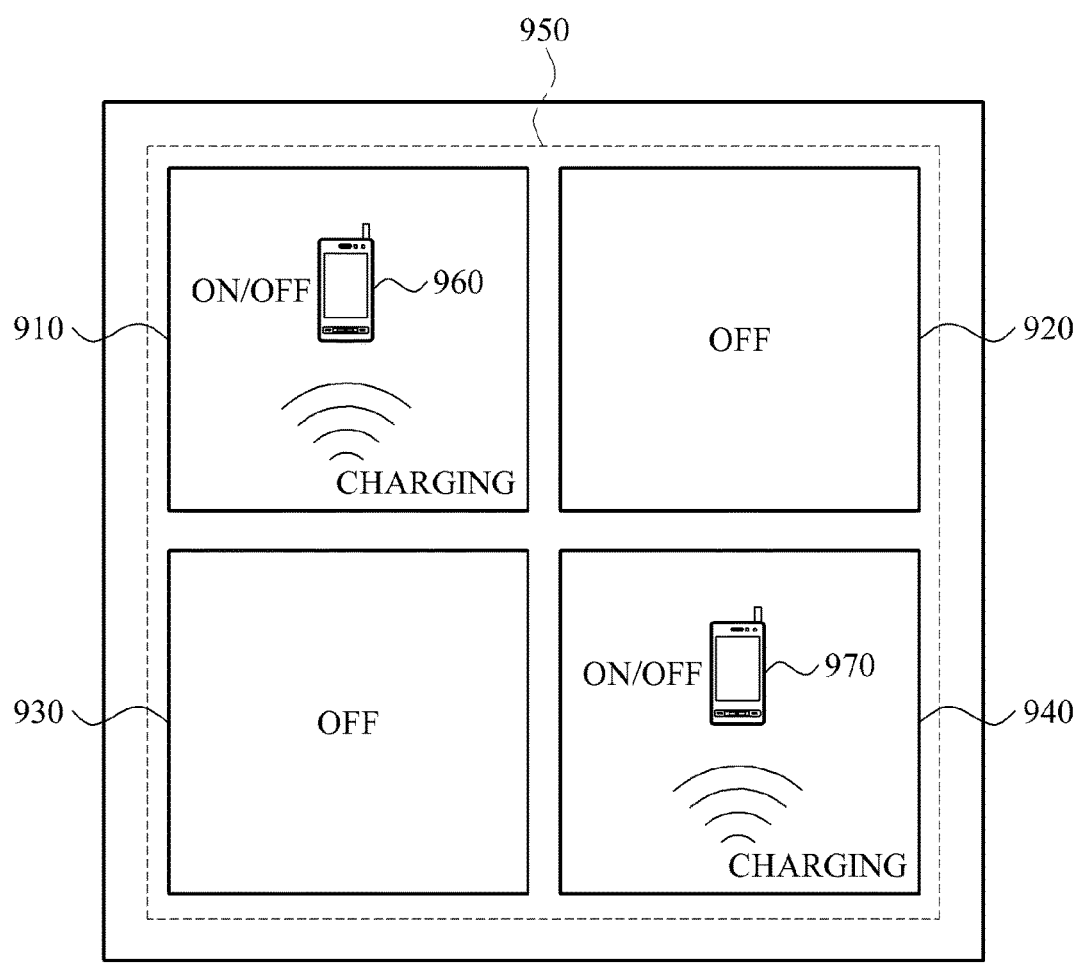
FIG. 9 is a diagram illustrating one configuration of a power transmitting unit of FIG. 8.

FIG. 9 illustrates one configuration of the power transmitting unit.

Figure 10:
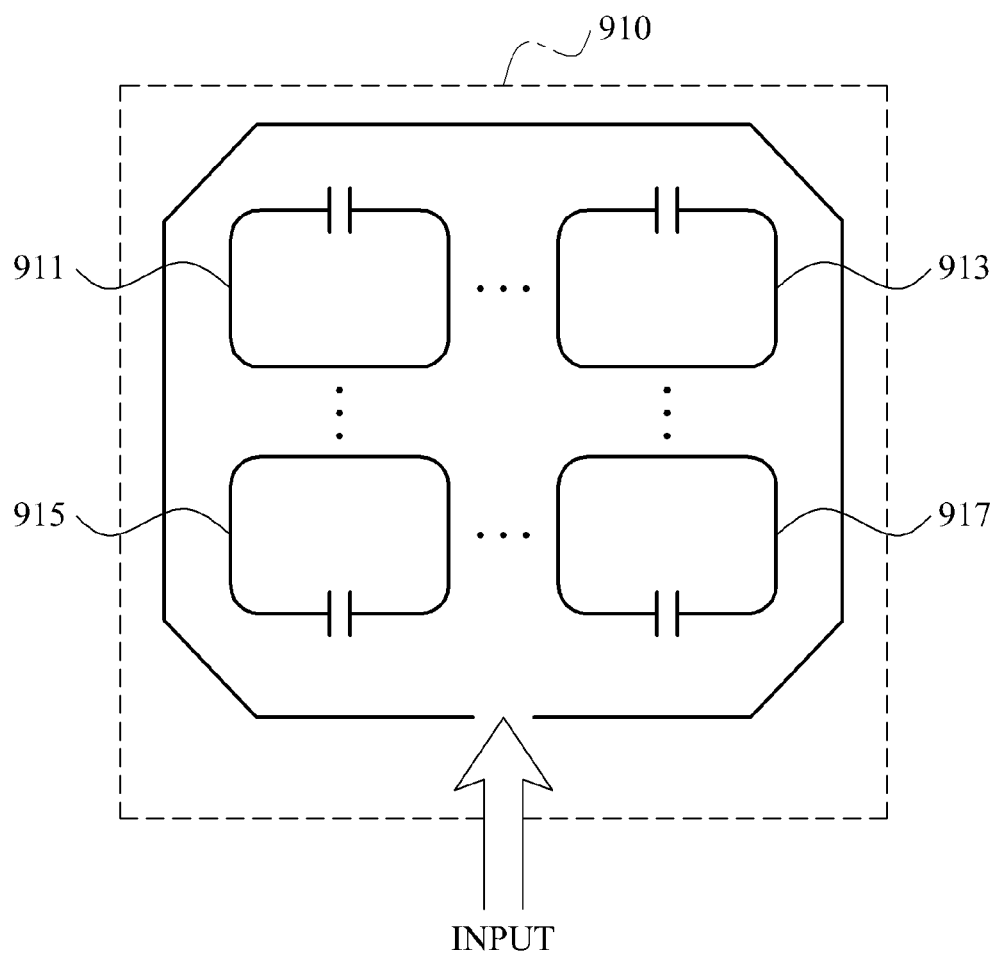
FIG. 10 is a diagram illustrating one configuration of the source resonating unit of FIG. 9.

As shown, the power transmitting unit 950 may include four source resonating units 910, 920, 930, and 940. The four source resonating units 910, 920, 930, and 940 may be formed as a single resonator, or may be formed as an array as illustrated in FIG. 10. Other configurations and arrangements of source resonators are also possible.

In FIG. 9, when a wake-up request signal is transmitted from the source resonating unit 910 to a target device 960, the target device 960 may be detected through a response signal in response to the wake-up request signal. The wake-up request signal may include information on an ID of the source resonating unit 910. The communication unit of FIG. 8 may perform out-band communication using a frequency assigned for data communication, and the power transmitting unit 830 of FIG. 8 may perform in-band communication for transmitting or receiving data to or from a target device using a resonance frequency. Accordingly, the response signal in response to the wake-up request signal may be received to the wireless power transmitter 800 through the in-band communication or the out-band communication.

When no response signal in response to the wake-up request signal is received for a predetermined period of time, switching to the next source resonating unit 920 may be performed. If no response signal is received for a predetermined period of time after a wake-up request signal is transmitted, the source resonating unit 920 may be maintained to be OFF. In the same or a similar manner, a target device 970 may be detected in the source resonating units 930 and 940.

As described above, the source resonating units 910, 920, 930, and 940 may be sequentially turned ON or OFF, and may broadcast a wake-up request signal, thereby detecting which source resonating unit located adjacent to a target device.

The source resonating units 910, 920, 930, and 940 may be respectively identified by IDs of the source resonating units 910, 920, 930, and 940. The controller 820 of FIG. 8 may also recognize locations of the one or more of plurality of target devices using the IDs of the source resonating units 910, 920, 930, and 940, respectively.

FIG. 10 illustrates one configuration of the source resonating unit 910 of FIG. 9. As illustrated in FIG. 10, the source resonating unit 910 may include at least four source resonators, for example source resonators 911, 913, 915, and 917 that form an array. The source resonating unit 831 of FIG. 8 may also be configured as illustrated in FIG. 10.

Additionally, the source resonating unit 910 or the source resonator unit 831 may include a single source resonator, differently from FIG. 10.

Figure 11:
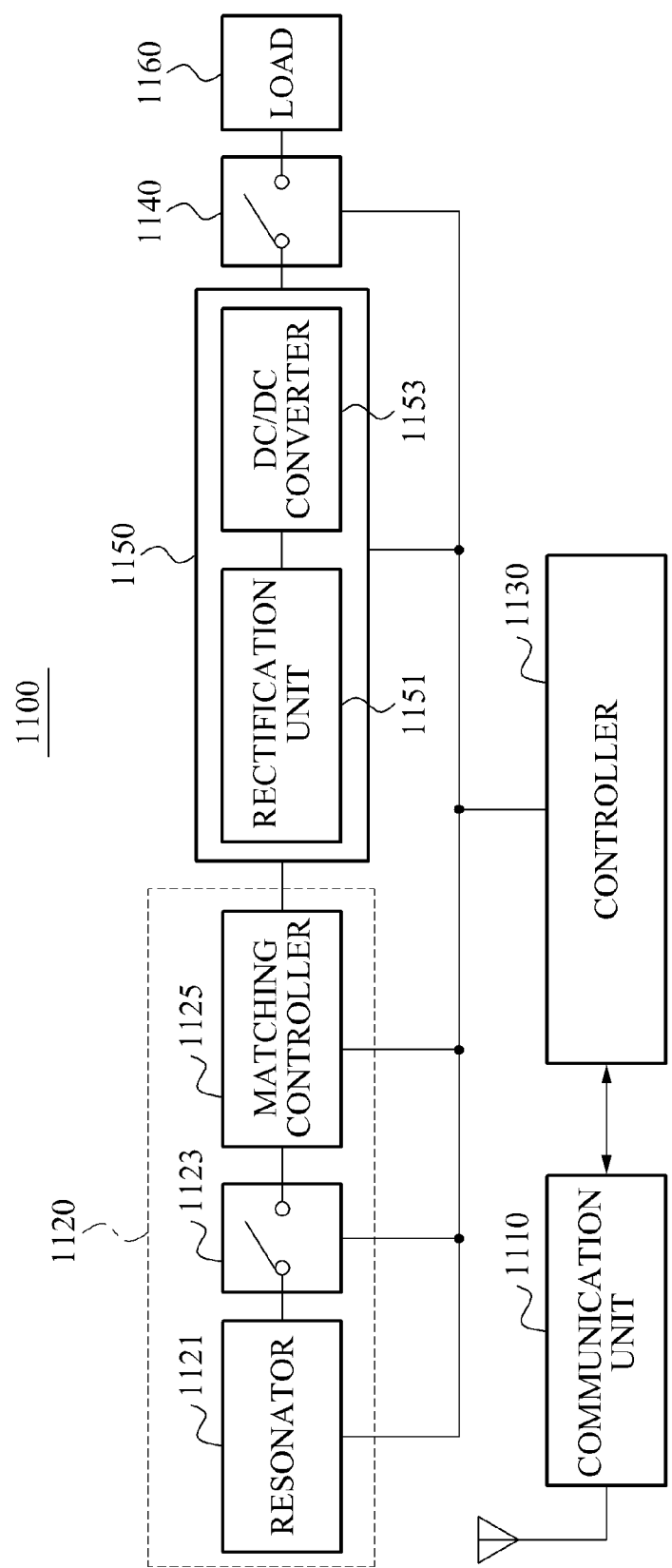
FIG. 11 is a diagram illustrating one configuration of a wireless power receiver.

FIG. 11 illustrates one configuration of a wireless power receiver.

As shown, a wireless power receiver 1100 may include a communication unit 1110, a power receiving unit 1120, and a controller 1130. Additionally, the wireless power receiver 1100 may further include a power supply unit 1150, and a load path switch 1140.

The communication unit 1110 may receive a wake-up request signal from the wireless power transmitter 800 of FIG. 8, and may transmit a response signal in response to the wake-up request signal to the wireless power transmitter 800. The response signal may include information on an ID of the wireless power receiver 1100, information on an ID of a neighboring source resonating unit received from the neighboring source resonating unit, and/or information on the amount of power to be used in the wireless power receiver 1100.

Additionally, the communication unit 1110 may receive the information on the ID of the neighboring source resonating unit through in-band communication from the neighboring source resonating unit, and may transmit the received information to the wireless power transmitter 800 via out-band communication.

The term "in-band" communication(s), as used herein, means communication(s) in which information (such as, for example, control information, data and/or metadata) is transmitted in the same frequency band, and/or on the same channel, as used for power transmission. According to one or more embodiments, the frequency may be a resonance frequency. And, the term "out-band" communication(s), as used herein, means communication(s) in which information (such as, for example, control information, data and/or metadata) is transmitted in a separate frequency band and/or using a separate or dedicated channel, than used for power transmission.

The power receiving unit 1120 may wirelessly receive power from a source resonating unit, or may form magnetic coupling with a target resonator T_other of another wireless power receiver to wirelessly receive power from the target resonator T_other. When an amount of power to be used in the wireless power receiver 1100 is greater than an amount of power to be used in the other wireless power receiver, the power receiving unit 1120 may wirelessly receive power from the source resonating unit. Additionally, when the amount of the power to be used in the wireless power receiver 1100 is less than the amount of the power to be used in the other wireless power receiver, the power receiving unit 1120 may wirelessly receive power from the target resonator T_other.

The power receiving unit 1120 may include a resonator 1121, a resonance switch 1123, and a matching controller 1125. The resonator 1121 may perform the same function as the target resonator 121 of FIG. 1. The resonance switch 1123 may be turned ON or OFF depending on a control of the controller 1130. The matching controller 1125 may perform impedance matching between the resonator 1121 and a load 1160, or impedance matching between the wireless power transmitter 800 and the resonator 1121. The matching controller 1125 may detect a reflected wave, or detect a change in impedance of the load 1160, to determine whether to perform the impedance matching. The resonator 1121 may be different in size or in the number of turns of a coil from the target resonator T_other. The number of turns of the coil may be the number of times a coil-shaped resonator is wound, for instance.

When power reception is terminated, the controller 1130 may disconnect the load 1160 by turning OFF the load path switch 1140. When the load path switch 1140 is turned OFF, the resonator 1121 cannot form magnetic coupling with any source resonator. The load 1160 may include, for example, one or more of: a battery, a circuit for consuming power, or an external device detachably attached to the wireless power receiver 1100.

The controller 1130 may be configured to compute the power transmission efficiency for power received wirelessly from the wireless power transmitter 800. When the wireless power transmitter 800 broadcasts an amount Pt of power transmitted, the controller 1130 may compute a ratio of the amount Pt and an amount Pr of power received, to obtain the power transmission efficiency. The controller 1130 may be configured to periodically compute the power transmission efficiency, and may transmit information on the power transmission efficiency to the wireless power transmitter 800 via the communication unit 1110.

Additionally, the controller 1130 may be configured to monitor a state of the load 1160. When charging of the load 1160 is completed, the controller 1130 may notify the wireless power transmitter 800 of completion of the charging of the load 1160.

The power supply unit 1150 may provide the load 1160 with power received wirelessly from the wireless power transmitter 800. The power supply unit 1150 may include a rectification unit 1151, and a DC/DC converter 1153. The rectification unit 1151 may generate a DC voltage by rectifying an AC voltage. The DC/DC converter 1153 may generate a DC voltage required by the load 1160 by adjusting the level of the DC voltage output from the rectification unit 1151.

Figure 12:
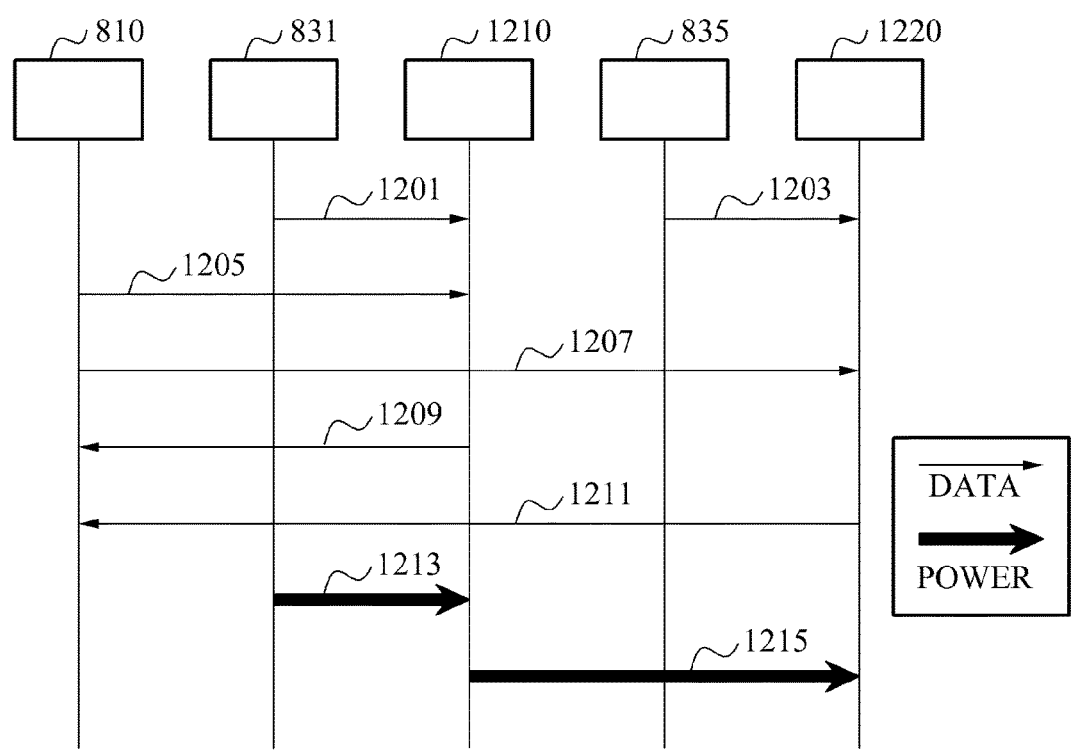
FIG. 12 is a diagram illustrating a method for controlling wireless power transmission.

FIG. 12 illustrates a method for controlling a wireless power transmission.

In FIG. 12, a first wireless power receiver 1210 may be a high power load, and a second wireless power receiver 1220 may be a low power load.

In operation 1201, the source resonating unit 831 may broadcast a wake-up request signal. The wake-up request signal broadcasted by the source resonating unit 831 may be received to the first wireless power receiver 1210. When a response signal is received from the first wireless power receiver 1210 within a predetermined time interval T1, the wireless power transmitter 800 may detect the first wireless power receiver 1210. Additionally, the wireless power transmitter 800 may determine that the first wireless power receiver 1210 is located within a coverage of the source resonating unit 831. The response signal may include information on the amount of power to be used in the first wireless power receiver 1210, and information on an ID of the first wireless power receiver 1210.

In operation 1203, the source resonating unit 835 may broadcast a wake-up request signal. The wake-up request signal broadcasted by the source resonating unit 835 may be received to the second wireless power receiver 1220. When a response signal is received from the second wireless power receiver 1220 within a predetermined time interval T2, the wireless power transmitter 800 may detect the second wireless power receiver 1220. Additionally, the wireless power transmitter 800 may determine that the second wireless power receiver 1220 is located within a coverage area of the source resonating unit 835. The response signal may include information on the amount of power to be used in the second wireless power receiver 1220, and information on an ID of the second wireless power receiver 1220.

Through operations 1201 and 1203, the wireless power transmitter 800 may detect a plurality of target devices that wirelessly receive power. Operations 1201 and 1203 may be performed to detect the plurality of target devices. Accordingly, in operations 1201 and 1203, the wireless power transmitter 800 may sequentially broadcast wake-up request signals using a plurality of source resonating units, and may sequentially receive response signals in response to the wake-up request signals from the plurality of target devices.

When target devices are detected via out-band communication, the detector 810 of the wireless power transmitter 800 may broadcast wake-up request signals in operations 1205 and 1207. In response to the wake-up request signals, the first wireless power receiver 1210 and the second wireless power receiver 1220 may transmit response signals to the wireless power transmitter 800 in operations 1209 and 1211.

The wireless power transmitter 800 may select the source resonating unit 831 adjacent to the high power load, and may transmit power to the first wireless power receiver 1210 through the source resonating unit 831 in operation 1213. In operation 1215, the second wireless power receiver 1220 may form a magnetic coupling with the first wireless power receiver 1210, and may receive power from the first wireless power receiver 1210.

According to embodiments, it may be possible to efficiently perform wireless power transmission to a plurality of wireless power receivers, thereby increasing an efficiency of a wireless power transmission system. Additionally, it may be possible to efficiently transmit a wireless power to different kinds of wireless power receivers. Furthermore, it may be possible to simultaneously transmit power to different kinds of wireless power receivers and the same kind of wireless power receivers.

In one or more embodiments, a source resonator and/or a target resonator may be configured as, for example, a helix coil structured resonator, a spiral coil structured resonator, a meta-structured resonator, and the like.

An electromagnetic characteristic of many materials found in nature is that they have a unique magnetic permeability or a unique permittivity. Most materials typically have a positive magnetic permeability or a positive permittivity. Thus, for these materials, a right hand rule may be applied to an electric field, a magnetic field, and a pointing vector and thus, the corresponding materials may be referred to as right handed materials (RHMs).

On the other hand, a material having a magnetic permeability or a permittivity which is not ordinarily found in nature or is artificially-designed (or man-made) may be referred to herein as a "metamaterial." Metamaterials may be classified into an epsilon negative (ENG) material, a mu negative (MNG) material, a double negative (DNG) material, a negative refractive index (NRI) material, a left-handed (LH) material, and the like, based on a sign of the corresponding permittivity or magnetic permeability.

The magnetic permeability may indicate a ratio between a magnetic flux density occurring with respect to a predetermined magnetic field in a corresponding material and a magnetic flux density occurring with respect to the predetermined magnetic field in a vacuum state. The magnetic permeability and the permittivity, in some embodiments, may be used to determine a propagation constant of a corresponding material in a predetermined frequency or a predetermined wavelength. An electromagnetic characteristic of the corresponding material may be determined based on the magnetic permeability and the permittivity. According to an aspect, the metamaterial may be easily disposed in a resonance state without significant material size changes. This may be practical for a relatively large wavelength area or a relatively low frequency area.

FIGS. 13 through 19B are diagrams illustrating various resonator structures.

Figure 13:
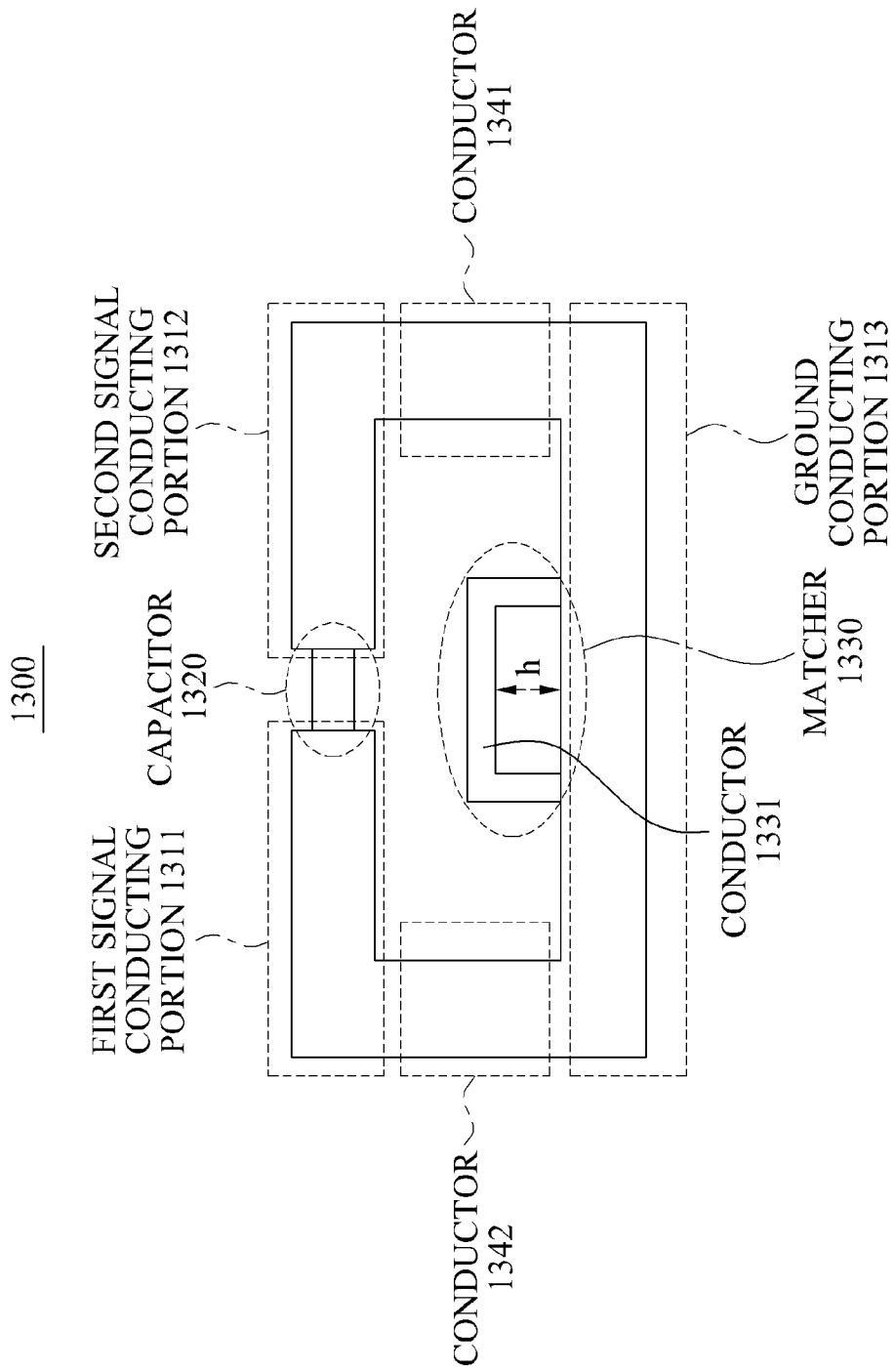
FIGS. 13 through 19B are diagrams illustrating various resonator structures.

FIG. 13 is a illustration of a two-dimensional (2D) resonator 1300.

As shown, the resonator 1300 having the 2D structure may include a transmission line, a capacitor 1320, a matcher 1330, and conductors 1341 and 1342. The transmission line may include, for instance, a first signal conducting portion 1311, a second signal conducting portion 1312, and a ground conducting portion 1313.

The capacitor 1320 may be inserted or otherwise positioned in series between the first signal conducting portion 1311 and the second signal conducting portion 1312 such that an electric field may be confined within the capacitor 1320, as illustrated in FIG. 13. In various implementations, the transmission line may include at least one conductor in an upper portion of the transmission line, and may also include at least one conductor in a lower portion of the transmission line. Current may flow through the at least one conductor disposed in the upper portion of the transmission line and the at least one conductor disposed in the lower portion of the transmission may be electrically grounded.

As illustrated in FIG. 13, the resonator 1300 may be configured to have a generally 2D structure. The transmission line may include the first signal conducting portion 1311 and the second signal conducting portion 1312 in the upper portion of the transmission line, and may include the ground conducting portion 1313 in the lower portion of the transmission line. As shown, the first signal conducting portion 1311 and the second signal conducting portion 1312 may be disposed to face the ground conducting portion 1313 with current flowing through the first signal conducting portion 1311 and the second signal conducting portion 1312.

In some implementations, one end of the first signal conducting portion 1311 may be electrically connected (i.e., shorted) to the conductor 1342, and another end of the first signal conducting portion 1311 may be connected to the capacitor 1320. And one end of the second signal conducting portion 1312 may be grounded to the conductor 1341, and another end of the second signal conducting portion 1312 may be connected to the capacitor 1320. Accordingly, the first signal conducting portion 1311, the second signal conducting portion 1312, the ground conducting portion 1313, and the conductors 1341 and 1342 may be connected to each other such that the resonator 1300 may have an electrically closed-loop structure. The term "closed-loop structure" as used herein, may include a polygonal structure, for example, a circular structure, a rectangular structure, or the like that is a circuit that is electrically closed. The capacitor 1320 may be inserted into an intermediate portion of the transmission line. For example, the capacitor 1320 may be inserted into a space between the first signal conducting portion 1311 and the second signal conducting portion 1312. The capacitor 1320 may be configured, in some instances, as a lumped element, a distributed element, or the like. In one implementation, a distributed capacitor may be configured as a distributed element and may include zigzagged conductor lines and a dielectric material having a relatively high permittivity between the zigzagged conductor lines.

When the capacitor 1320 is inserted into the transmission line, the resonator 1300 may have a property of a metamaterial, as discussed above. For example, the resonator 1300 may have a negative magnetic permeability due to the capacitance of the capacitor 1320. If so, the resonator 1300 may also be referred to as a mu negative (MNG) resonator. Various criteria may be applied to determine the capacitance of the capacitor 1320. For example, the various criteria may include for enabling the resonator 1300 to have the characteristic of the metamaterial may include one or more of the following: a criterion to enable the resonator 1300 to have a negative magnetic permeability in a target frequency, a criterion to enable the resonator 1300 to have a zeroth order resonance characteristic in the target frequency, or the like. The resonator 1300, also referred to as the MNG resonator 1300, may also have a zeroth order resonance characteristic (i.e., having, as a resonance frequency, a frequency when a propagation constant is "0"). If the resonator 1300 has the zeroth order resonance characteristic, the resonance frequency may be independent with respect to a physical size of the MNG resonator 1300. Moreover, by appropriately designing the capacitor 1320, the MNG resonator 1300 may sufficiently change the resonance frequency without significantly changing the physical size of the MNG resonator 1300.

In a near field, for instance, the electric field may be concentrated on the capacitor 1320 inserted into the transmission line. Accordingly, due to the capacitor 1320, the magnetic field may become dominant in the near field. In one or more embodiments, the MNG resonator 1300 may have a relatively high Q-factor using the capacitor 1320 of the lumped element. Thus, it may be possible to enhance power transmission efficiency. For example, the Q-factor indicates a level of an ohmic loss or a ratio of a reactance with respect to a resistance in the wireless power transmission. The efficiency of the wireless power transmission may increase according to an increase in the Q-factor.

The MNG resonator 1300 may include a matcher 1330 to be used in impedance matching. For example, the matcher 1330 may be configured to appropriately determine and adjust the strength of a magnetic field of the MNG resonator 1300. Depending on the configuration, current may flow in the MNG resonator 1300 via a connector, or may flow out from the MNG resonator 1300 via the connector. The connector may be connected to the ground conducting portion 1313 or the matcher 1330. In some instances, the power may be transferred through coupling without using a physical connection between the connector and the ground conducting portion 1313 or the matcher 1330.

As illustrated in FIG. 13, the matcher 1330 may be positioned within the loop formed by the loop structure of the resonator 1300. The matcher 1330 may adjust the impedance of the resonator 1300 by changing the physical shape of the matcher 1330. For example, the matcher 1330 may include the conductor 1331 to be used in the impedance matching positioned in a location that is separate from the ground conducting portion 1313 by a distance h. The impedance of the resonator 1300 may be changed by adjusting the distance h.

Although not illustrated in FIG. 13, a controller may be provided to control the matcher 1330. In this example, the matcher 1330 may change the physical shape of the matcher 1330 based on a control signal generated by the controller. For example, the distance h between the conductor 1331 of the matcher 1330 and the ground conducting portion 1313 may be increased or decreased based on the control signal. Accordingly, the physical shape of the matcher 1330 may be changed whereby the impedance of the resonator 1300 may be adjusted.

In some instances, the matcher 1330 may be provided that is configured as a passive element such as the conductor 1331, for example. Of course, if other embodiments, the matcher 1330 may be configured as an active element such as a diode, a transistor, or the like. If the active element is included in the matcher 1330, the active element may be driven based on the control signal generated by the controller, and the impedance of the resonator 1300 may be adjusted based on the control signal. For example, when the active element is a diode included in the matcher 1330, the impedance of the resonator 1300 may be adjusted depending on whether the diode is in an ON state or in an OFF state.

In some instances, a magnetic core may be further provided to pass through the MNG resonator 1300. The magnetic core may perform a function of increasing the power transmission distance.

Figure 14:
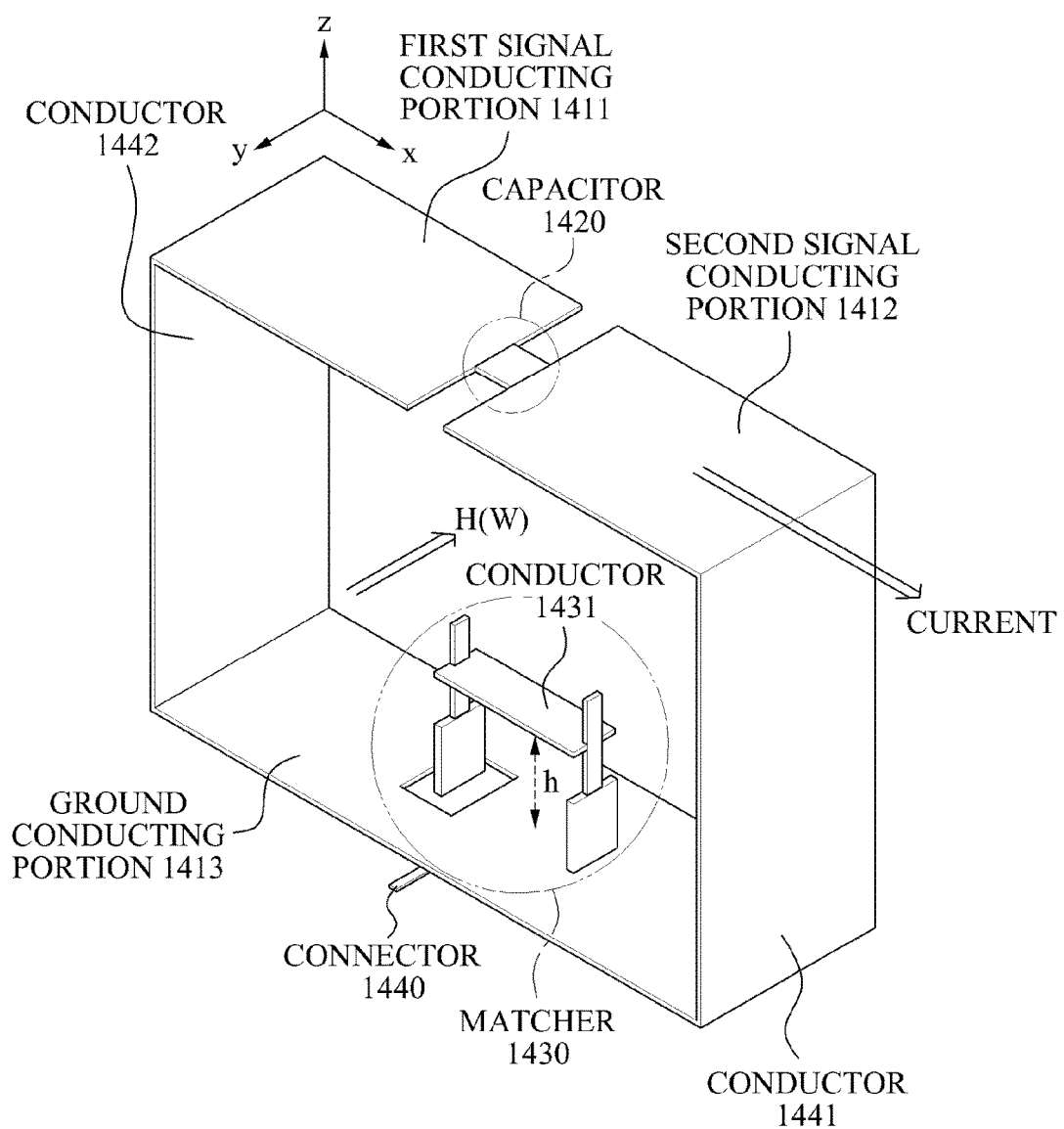

FIG. 14 is an illustration of a three-dimensional (3D) resonator 1400.

Referring to FIG. 14, the resonator 1400 having the 3D structure may include a transmission line and a capacitor 1420. The transmission line may include a first signal conducting portion 1411, a second signal conducting portion 1412, and a ground conducting portion 1413. The capacitor 1420 may be inserted, for instance, in series between the first signal conducting portion 1411 and the second signal conducting portion 1412 of the transmission link such that an electric field may be confined within the capacitor 1420.

As illustrated in FIG. 14, the resonator 1400 may have a generally 3D structure. The transmission line may include the first signal conducting portion 1411 and the second signal conducting portion 1412 in an upper portion of the resonator 1400, and may include the ground conducting portion 1413 in a lower portion of the resonator 1400. The first signal conducting portion 1411 and the second signal conducting portion 1412 may be disposed to face the ground conducting portion 1413. In this arrangement, current may flow in an x direction through the first signal conducting portion 1411 and the second signal conducting portion 1412. Due to the current, a magnetic field H(W) may be formed in a −y direction. However, it will be appreciated that the magnetic field H(W) might also be formed in the opposite direction (e.g., a +y direction) in other implementations.

In one or more embodiments, one end of the first signal conducting portion 1411 may be electrically connected (i.e., shorted) to the conductor 1442, and another end of the first signal conducting portion 1411 may be connected to the capacitor 1420. One end of the second signal conducting portion 1412 may be grounded to the conductor 1441, and another end of the second signal conducting portion 1412 may be connected to the capacitor 1420. Accordingly, the first signal conducting portion 1411, the second signal conducting portion 1412, the ground conducting portion 1413, and the conductors 1441 and 1442 may be connected to each other, whereby the resonator 1400 may have an electrically closed-loop structure. As illustrated in FIG. 14, the capacitor 1420 may be inserted or otherwise positioned between the first signal conducting portion 1411 and the second signal conducting portion 1412. For example, the capacitor 1420 may be inserted into a space between the first signal conducting portion 1411 and the second signal conducting portion 1412. The capacitor 1420 may include, for example, a lumped element, a distributed element, and the like. In one implementation, a distributed capacitor having the shape of the distributed element may include zigzagged conductor lines and a dielectric material having a relatively high permittivity positioned between the zigzagged conductor lines.

When the capacitor 1420 is inserted into the transmission line, the resonator 1400 may have a property of a metamaterial, in some instances, as discussed above. For example, when the capacitor is configured as a lumped element, the resonator 1400 may have the characteristic of the metamaterial. When the resonator 1400 has a negative magnetic permeability by appropriately adjusting the capacitance of the capacitor 1420, the resonator 1400 may also be referred to as an MNG resonator. Various criteria may be applied to determine the capacitance of the capacitor 1420. For example, the various criteria may include one or more of the following: a criterion to enable the resonator 1400 to have the characteristic of the metamaterial, a criterion to enable the resonator 1400 to have a negative magnetic permeability in a target frequency, a criterion to enable the resonator 1400 to have a zeroth order resonance characteristic in the target frequency, or the like. Based on at least one criterion among the aforementioned criteria, the capacitance of the capacitor 1420 may be determined.

The resonator 1400, also referred to as the MNG resonator 1400, may have a zeroth order resonance characteristic (i.e., having, as a resonance frequency, a frequency when a propagation constant is "0"). If the resonator 1400 has a zeroth order resonance characteristic, the resonance frequency may be independent with respect to a physical size of the MNG resonator 1400. Thus, by appropriately designing the capacitor 1420, the MNG resonator 1400 may sufficiently change the resonance frequency without significantly changing the physical size of the MNG resonator 1400.

Referring to the MNG resonator 1400 of FIG. 14, in a near field, the electric field may be concentrated on the capacitor 1420 inserted into the transmission line. Accordingly, due to the capacitor 1420, the magnetic field may become dominant in the near field. Since the MNG resonator 1400 having the zeroth-order resonance characteristic may have characteristics similar to a magnetic dipole, the magnetic field may become dominant in the near field. A relatively small amount of the electric field formed due to the insertion of the capacitor 1420 may be concentrated on the capacitor 1420 and thus, the magnetic field may become further dominant. The MNG resonator 1400 may have a relatively high Q-factor using the capacitor 1420 of the lumped element and thus, it may be possible to enhance an efficiency of power transmission. Also, the MNG resonator 1400 may include the matcher 1430 to be used in impedance matching. The matcher 1430 may be configured to appropriately adjust the strength of magnetic field of the MNG resonator 1400. The impedance of the MNG resonator 1400 may be determined by the matcher 1430. In one or more embodiments, current may flow in the MNG resonator 1400 via a connector 1440, or may flow out from the MNG resonator 1400 via the connector 1440. And the connector 1440 may be connected to the ground conducting portion 1413 or the matcher 1430.

As illustrated in FIG. 14, the matcher 1430 may be positioned within the loop formed by the loop structure of the resonator 1400. The matcher 1430 may be configured to adjust the impedance of the resonator 1400 by changing the physical shape of the matcher 1430. For example, the matcher 1430 may include the conductor 1431 to be used in the impedance matching in a location separate from the ground conducting portion 1413 by a distance h.

The impedance of the resonator 1400 may be changed by adjusting the distance h. In some implementations, a controller may be provided to control the matcher 1430. In this case, the matcher 1430 may change the physical shape of the matcher 1430 based on a control signal generated by the controller. For example, the distance h between the conductor 1431 of the matcher 1430 and the ground conducting portion 1413 may be increased or decreased based on the control signal. Accordingly, the physical shape of the matcher 1430 may be changed such that the impedance of the resonator 1400 may be adjusted. The distance h between the conductor 1431 of the matcher 1430 and the ground conducting portion 1413 may be adjusted using a variety of schemes. For example, one or more conductors may be included in the matcher 1430 and the distance h may be adjusted by adaptively activating one of the conductors. Alternatively or additionally, the distance h may be adjusted by adjusting the physical location of the conductor 1431 up and down. For instance, the distance h may be controlled based on the control signal of the controller. The controller may generate the control signal using various factors. As illustrated in FIG. 14, the matcher 1430 may be configured as a passive element such as the conductor 1431, for instance. Of course, in other embodiments, the matcher 1430 may be configured as an active element such as a diode, a transistor, or the like. If the active element is included in the matcher 1430, the active element may be driven based on the control signal generated by the controller, and the impedance of the resonator 1400 may be adjusted based on the control signal. For example, if the active element is a diode included in the matcher 1430, the impedance of the resonator 1400 may be adjusted depending on whether the diode is in an ON state or in an OFF state.

In some implementations, a magnetic core may be further provided to pass through the resonator 1400 configured as the MNG resonator. The magnetic core may increase the power transmission distance.

Figure 15:
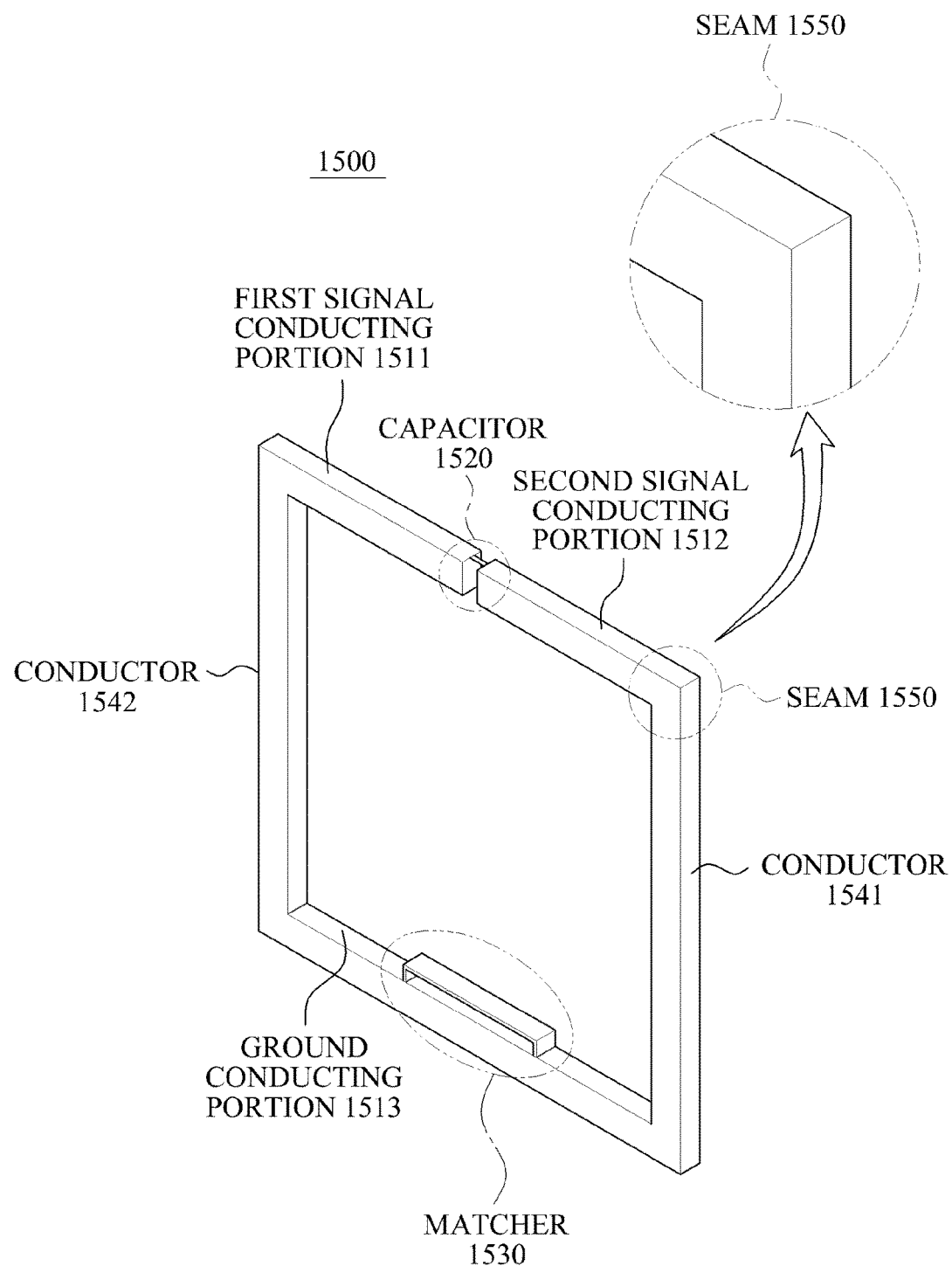

FIG. 15 illustrates a resonator 1500 for a wireless power transmission configured as a bulky type.

As used herein, the term "bulky type" may refer to a seamless connection connecting at least two parts in an integrated form.

Referring to FIG. 15, a first signal conducting portion 1511 and a conductor 1542 may be integrally formed, rather than being separately manufactured and being connected to each other. Similarly, a second signal conducting portion 1512 and a conductor 1541 may also be integrally manufactured.

When the second signal conducting portion 1512 and the conductor 1541 are separately manufactured and then are connected to each other, a loss of conduction may occur due to a seam 1550. The second signal conducting portion 1512 and the conductor 1541 may be connected to each other without using a separate seam (i.e., seamlessly connected to each other). Accordingly, it may be possible to decrease a conductor loss caused by the seam 1550. Similarly, the second signal conducting portion 1512 and a ground conducting portion 1513 may be seamlessly and integrally manufactured. In addition, the first signal conducting portion 1511 and the ground conducting portion 1513 may be seamlessly and/or integrally manufactured.

A matcher 1530 may be provided that is similarly constructed as described herein in one or more embodiments.

Figure 16:
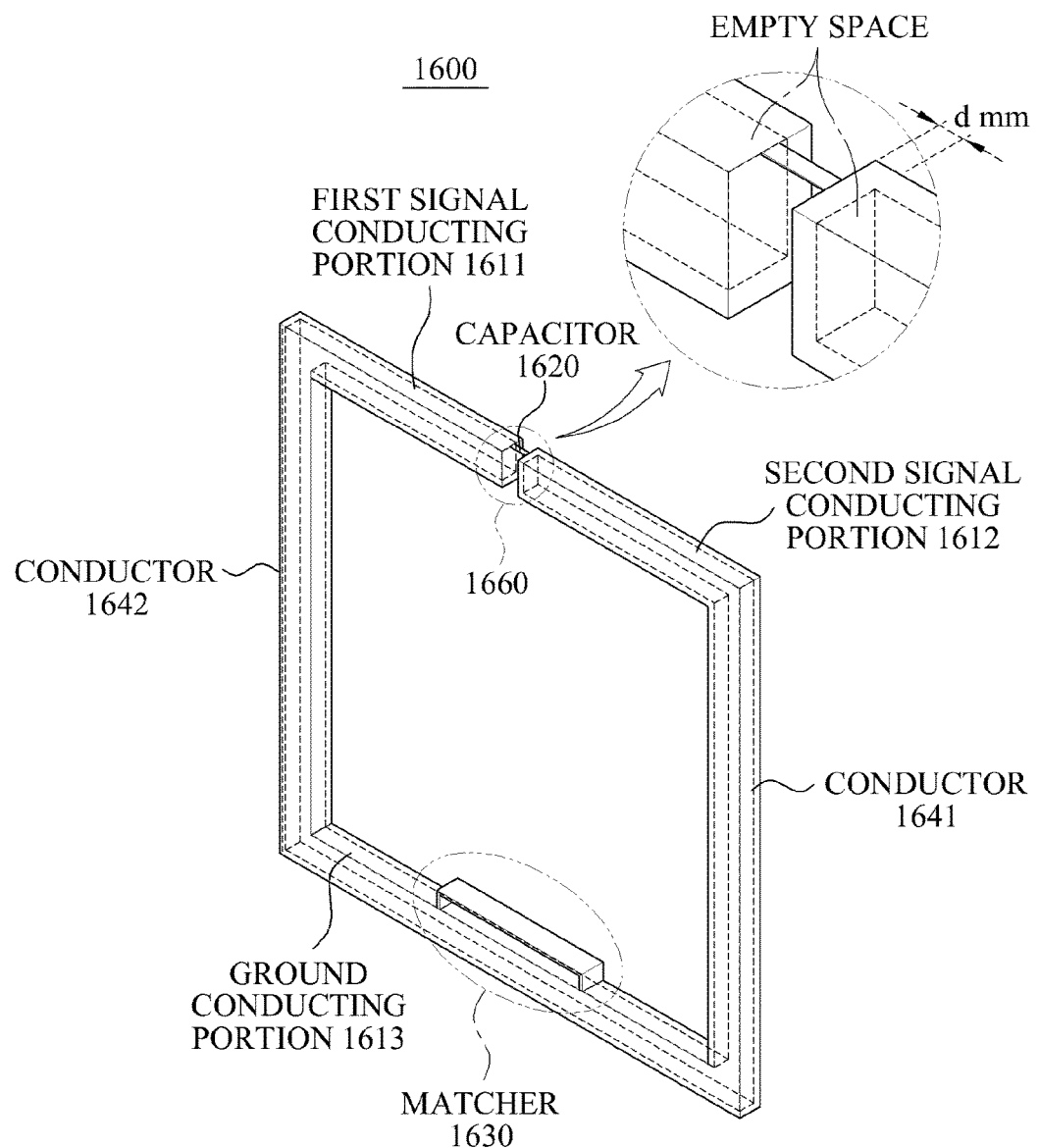

FIG. 16 illustrates a resonator 1600 for a wireless power transmission, configured as a hollow type.

Referring to FIG. 16, each of a first signal conducting portion 1611, a second signal conducting portion 1612, a ground conducting portion 1613, and conductors 1641 and 1642 of the resonator 1600 configured as the hollow type structure. As used herein the term "hollow type" refers to a configuration that may include an empty space inside.

For a given resonance frequency, an active current may be modeled to flow in only a portion of the first signal conducting portion 1611 instead of all of the first signal conducting portion 1611, a portion of the second signal conducting portion 1612 instead of all of the second signal conducting portion 1612, a portion of the ground conducting portion 1613 instead of all of the ground conducting portion 1613, and portions of the conductors 1641 and 1642 instead of all of the conductors 1641 and 1642. When a depth of each of the first signal conducting portion 1611, the second signal conducting portion 1612, the ground conducting portion 1613, and the conductors 1641 and 1642 is significantly deeper than a corresponding skin depth in the predetermined resonance frequency, such a structure may be ineffective. The significantly deeper depth may, however, increase the weight or manufacturing costs of the resonator 1600, in some instances.

Accordingly, for the given resonance frequency, the depth of each of the first signal conducting portion 1611, the second signal conducting portion 1612, the ground conducting portion 1613, and the conductors 1641 and 1642 may be appropriately determined based on the corresponding skin depth of each of the first signal conducting portion 1611, the second signal conducting portion 1612, the ground conducting portion 1613, and the conductors 1641 and 1642. When one or more of the first signal conducting portion 1611, the second signal conducting portion 1612, the ground conducting portion 1613, and the conductors 1641 and 1642 have an appropriate depth deeper than a corresponding skin depth, the resonator 1600 may be manufactured to be lighter, and the manufacturing costs of the resonator 1600 may also decrease.

For example, as illustrated in FIG. 16, the depth of the second signal conducting portion 1612 (as further illustrated in the enlarged view region 1660 indicated by a circle) may be determined as "d" mm, and d may be determined according to $$d = \frac{1}{\sqrt{\pi f \mu \sigma}}.$$

Here, f denotes a frequency, $\mu$ denotes a magnetic permeability, and $\sigma$ denotes a conductor constant. In one implementation, when the first signal conducting portion 1611, the second signal conducting portion 1612, the ground conducting portion 1613, and the conductors 1641 and 1642 are made of copper and they have a conductivity of $5.8 \times 10^7$ siemens per meter ($S \cdot m^{-1}$), the skin depth may be about 0.6 mm with respect to 10 kHz of the resonance frequency, and the skin depth may be about 0.006 mm with respect to 100 MHz of the resonance frequency.

A capacitor 1620 and a matcher 1630 may be provided that are similarly constructed as described herein in one or more embodiments.

Figure 17:
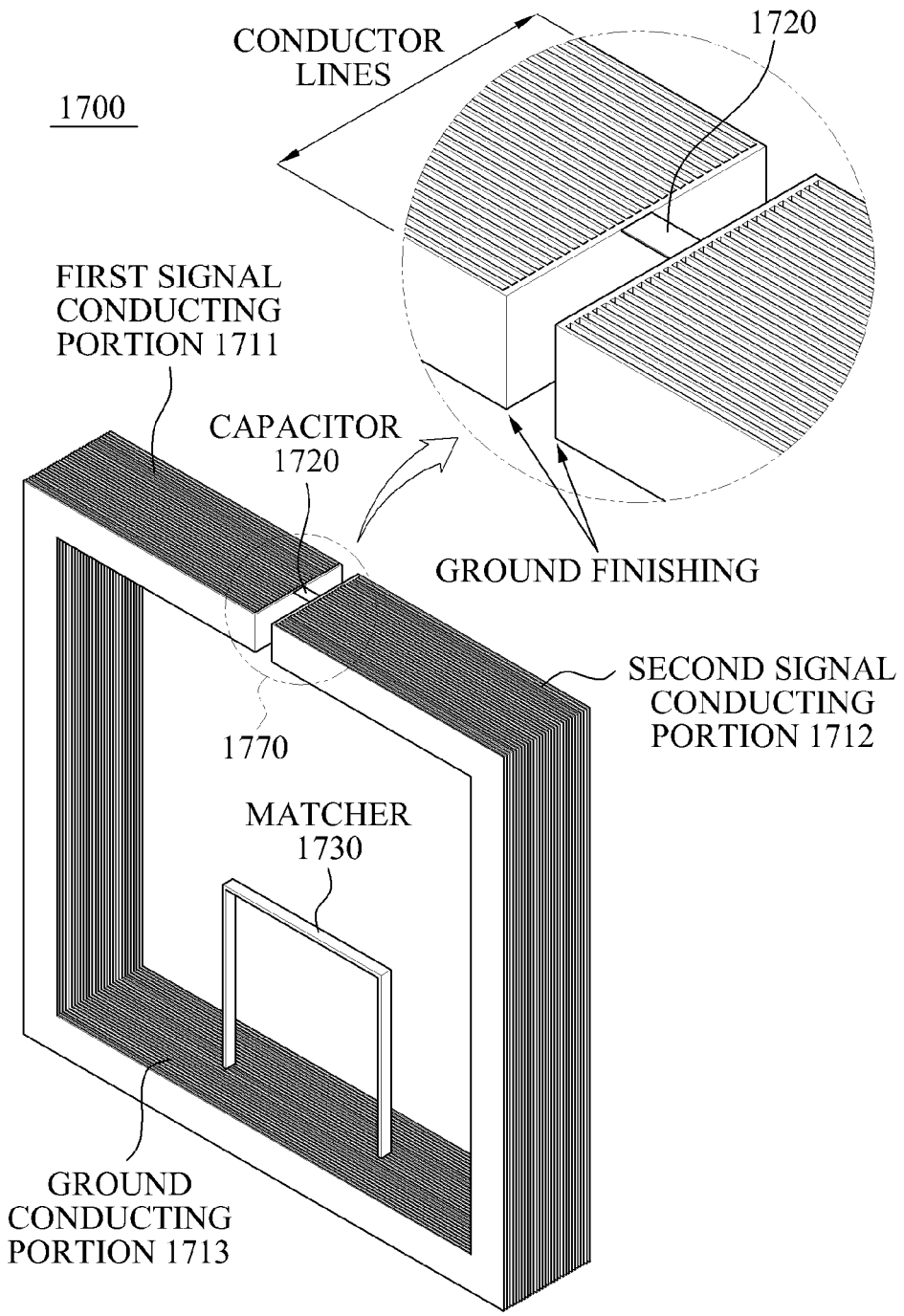

FIG. 17 illustrates a resonator 1700 for a wireless power transmission using a parallel-sheet configuration.

Referring to FIG. 17, the parallel-sheet configuration may be applicable to a first signal conducting portion 1711 and a second signal conducting portion 1712 included in the resonator 1700.

The first signal conducting portion 1711 and/or the second signal conducting portion 1712 may not be perfect conductors, and thus may have an inherent resistance. Due to this resistance, an ohmic loss may occur. The ohmic loss may decrease a Q-factor and may also decrease a coupling effect.

By applying the parallel-sheet configuration to each of the first signal conducting portion 1711 and the second signal conducting portion 1712, it may be possible to decrease the ohmic loss, and to increase the Q-factor and the coupling effect. Referring to the enlarged view portion 1770 (indicated by a circle in FIG. 17), when the parallel-sheet configuration is applied, each of the first signal conducting portion 1711 and the second signal conducting portion 1712 may include a plurality of conductor lines. The plurality of conductor lines may be disposed in parallel, and may be electrically connected (i.e., shorted) at an end portion of each of the first signal conducting portion 1711 and the second signal conducting portion 1712.

As described above, when the parallel-sheet configuration is applied to one or both of the first signal conducting portion 1711 and the second signal conducting portion 1712, the plurality of conductor lines may be disposed in parallel. Accordingly, the sum of resistances having the conductor lines may decrease. Consequently, the resistance loss may decrease, and the Q-factor and the coupling effect may increase.

A capacitor 1720 and a matcher 1730 positioned on the ground conducting portion 1713 may be provided that are similarly constructed as described herein in one or more embodiments.

Figure 18:
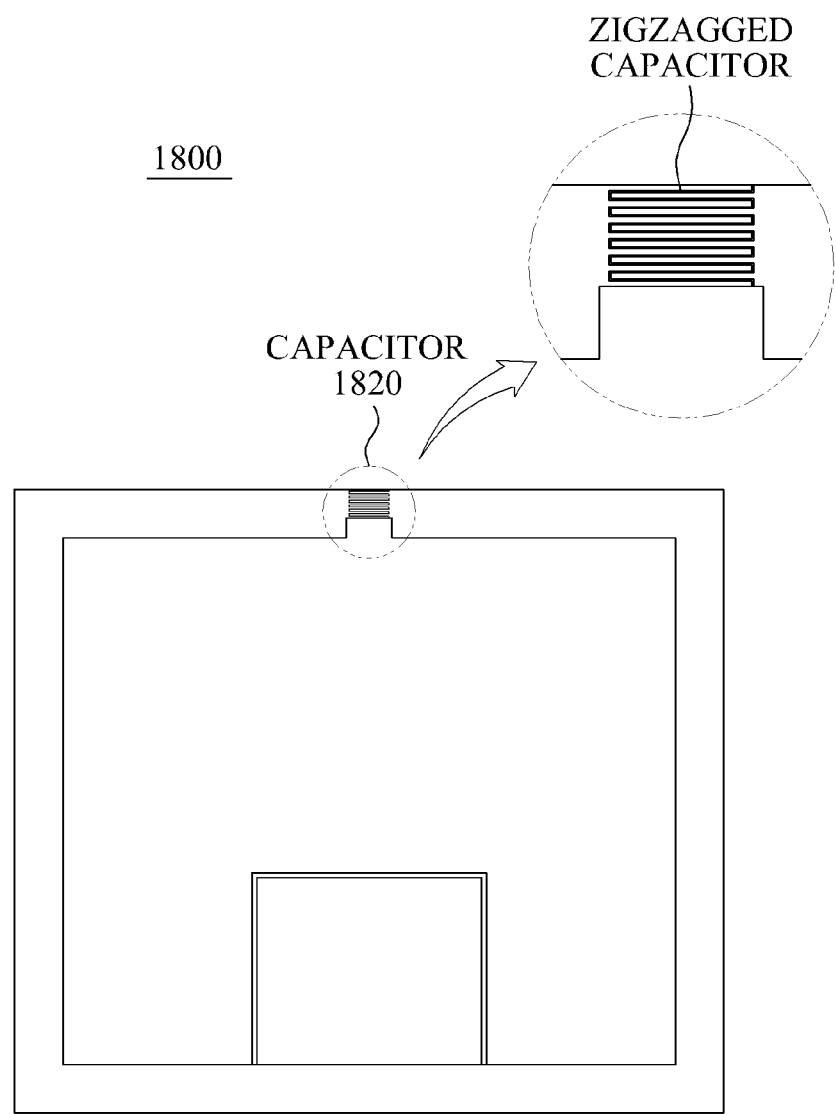

FIG. 18 illustrates a resonator 1800 for a wireless power transmission including a distributed capacitor.

Referring to FIG. 18, a capacitor 1820 included in the resonator 1800 is configured for the wireless power transmission. A capacitor used as a lumped element may have a relatively high equivalent series resistance (ESR). A variety of schemes have been proposed to decrease the ESR contained in the capacitor of the lumped element. According to an example embodiment, by using the capacitor 1820 as a distributed element, it may be possible to decrease the ESR. As will be appreciated, a loss caused by the ESR may decrease a Q-factor and a coupling effect.

As illustrated in FIG. 18, the capacitor 1820 may be configured as a conductive line having the zigzagged structure.

By employing the capacitor 1820 as the distributed element, it may be possible to decrease the loss occurring due to the ESR in some instances. In addition, by disposing a plurality of capacitors as lumped elements, it may be possible to decrease the loss occurring due to the ESR. Since a resistance of the capacitors as the lumped elements decreases through a parallel connection, active resistances of parallel-connected capacitors as the lumped elements may also decrease such that the loss occurring due to the ESR may decrease. For example, by employing ten capacitors of 1 pF each instead of using a single capacitor of 10 pF, it may be possible to decrease the loss occurring due to the ESR.

Figure 19A:
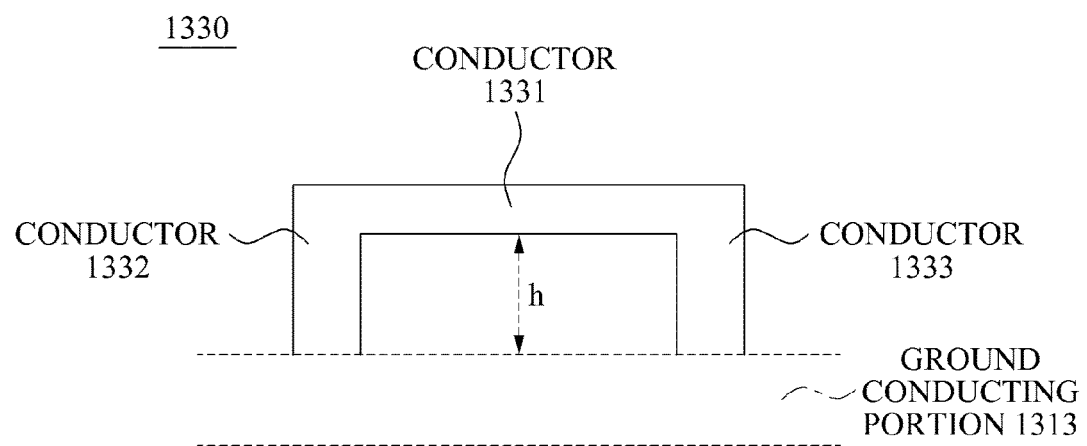
Figure 19B:
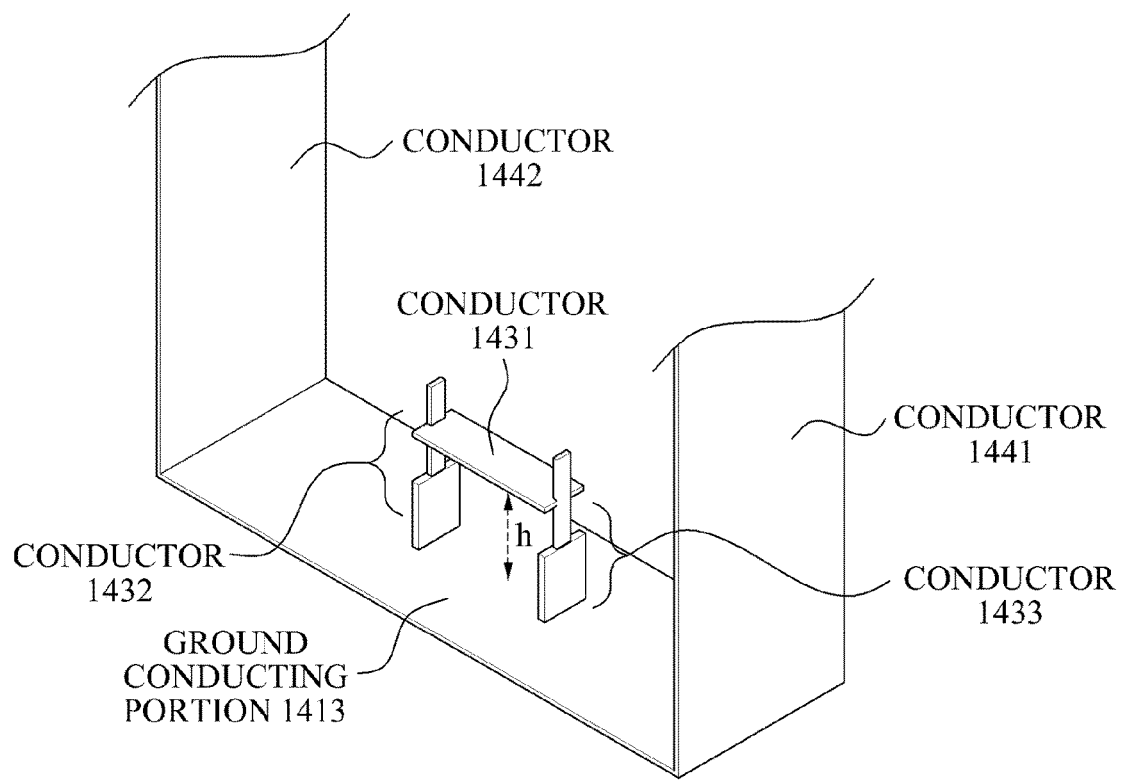

FIG. 19A illustrates one embodiment of the matcher 1330 used in the resonator 1300 illustrated in FIG. 13, and FIG. 19B illustrates an example of the matcher 1430 used in the resonator 1400 illustrated in FIG. 14.

FIG. 19A illustrates a portion of the resonator 1300 of FIG. 13 including the matcher 1330, and FIG. 19B illustrates a portion of the resonator 1400 of FIG. 14 including the matcher 1430.

Referring to FIG. 19A, the matcher 1330 may include the conductor 1331, a conductor 1332, and a conductor 1333. The conductors 1332 and 1333 may be connected to the ground conducting portion 1313 and the conductor 1331. The impedance of the 2D resonator may be determined based on a distance h between the conductor 1331 and the ground conducting portion 1313. The distance h between the conductor 1331 and the ground conducting portion 1313 may be controlled by the controller. The distance h between the conductor 1331 and the ground conducting portion 1313 may be adjusted using a variety of schemes. For example, the variety of schemes may include one or more of the following: a scheme of adjusting the distance h by adaptively activating one of the conductors 1331, 1332, and 1333, a scheme of adjusting the physical location of the conductor 1331 up and down, and/or the like.

Referring to FIG. 19B, the matcher 1430 may include the conductor 1431, a conductor 1432, a conductor 1433 and conductors 941 and 942. The conductors 1432 and 1433 may be connected to the ground conducting portion 1413 and the conductor 1431. The impedance of the 3D resonator may be determined based on a distance h between the conductor 1431 and the ground conducting portion 1413. The distance h between the conductor 1431 and the ground conducting portion 1413 may be controlled by the controller, for example. Similar to the matcher 1330 illustrated in FIG. 19A, in the matcher 1430, the distance h between the conductor 1431 and the ground conducting portion 1413 may be adjusted using a variety of schemes. For example, the variety of schemes may include one or more of the following: a scheme of adjusting the distance h by adaptively activating one of the conductors 1431, 1432, and 1433, a scheme of adjusting the physical location of the conductor 1431 up and down, and the like.

In some implementations, the matcher may include an active element. Thus, a scheme of adjusting an impedance of a resonator using the active element may be similar to the examples described above. For example, the impedance of the resonator may be adjusted by changing a path of current flowing through the matcher using the active element.

Figure 20:
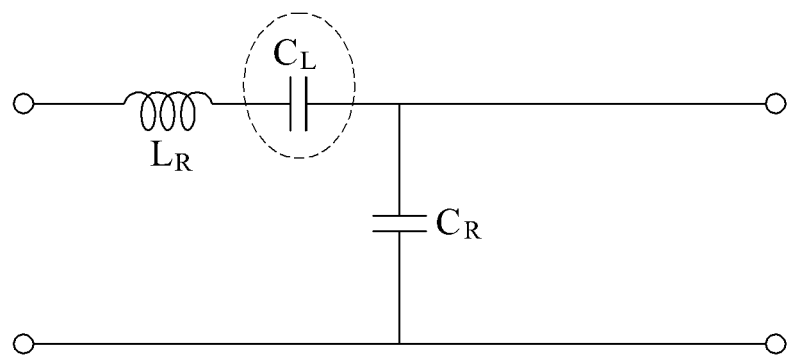
FIG. 20 is a diagram illustrating one equivalent circuit of a resonator of FIG. 13.

FIG. 20 illustrates one equivalent circuit of the resonator 1300 of FIG. 13.

The resonator 1300 of FIG. 13 used in a wireless power transmission may be modeled to the equivalent circuit of FIG. 20. In the equivalent circuit depicted in FIG. 20, $L_R$ denotes an inductance of the power transmission line, $C_L$ denotes the capacitor 1320 that is inserted in a form of a lumped element in the middle of the power transmission line, and $C_R$ denotes a capacitance between the power transmissions and/or ground of FIG. 13.

In some instances, the resonator 1300 may have a zeroth resonance characteristic. For example, when a propagation constant is "0", the resonator 1300 may be assumed to have $\omega_{MZR}$ as a resonance frequency. The resonance frequency $\omega_{MZR}$ may be expressed by Equation 2.

$$\omega_{MZR} = \frac{1}{\sqrt{L_R C_L}} \qquad \text{[Equation 2]}$$

In Equation 2, MZR denotes a Mu zero resonator.

Referring to Equation 2, the resonance frequency $\omega_{MZR}$ of the resonator 1300 may be determined by $$L_R/C_L.$$

A physical size of the resonator 1300 and the resonance frequency $\omega_{MZR}$ may be independent with respect to each other. Since the physical sizes are independent with respect to each other, the physical size of the resonator 1300 may be sufficiently reduced.

The units described herein may be implemented using hardware components, software components, or a combination thereof. For example, a processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and data may be stored by one or more computer readable recording mediums. The computer readable recording medium may include any data storage device that can store data which can be thereafter read by a computer system or processing device. Examples of the computer readable recording medium include read-only memory (ROM), random-access memory (RAM), CD-ROMs, magnetic tapes, floppy disks, optical data storage devices. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A wireless power transmitting apparatus, the apparatus comprising:
a power transmitter having a plurality of power transmitting elements; and
a controller configured to:
detect a first target device configured to receive wireless power,
receive information on an amount of power required by the first target device and identification (ID) information of the first target device from the first target device,
select at least one power transmitting element from among the plurality of power transmitting elements, based on the ID information of the first target device, and
control the power transmitter to transmit, to the first target device, wireless power corresponding to the information on the amount of power required by the first target device via the selected at least one power transmitting element.

2. The wireless power transmitting apparatus of claim 1, wherein the controller further configured to control the power transmitter to transmit, to a second target device, wireless power via at least one power transmitting element selected from among the plurality of power transmitting elements based on ID information of the second target device.

3. The wireless power transmitting apparatus of claim 2, wherein the at least one power transmitting element selected based on the ID information of the first target device and the at least one power transmitting element selected based on the ID information of the second target device are arranged in an array.

4. The wireless power transmitting apparatus of claim 2, an amount of power transmitted by the at least one power transmitting element selected based on the ID information of the first target device is different from an amount of power transmitted by the at least one power transmitting element selected based on the ID information of the second target device.

5. The wireless power transmitting apparatus of claim 2, wherein a frequency of wireless power by the at least one power transmitting element selected based on the ID information of the first target device is different from a frequency of wireless power by the at least one power transmitting element selected based on the ID information of the second target device.

6. The wireless power transmitting apparatus of claim 1, wherein the controller further configure to:
detect a second target device configured to receive wireless power,
receive information on an amount of power required by the second target device and ID information of the second target device from the second target device, select at least one power transmitting element from among the plurality of power transmitting elements, based on the ID information of the second target device, and control the power transmitter to transmit, to the second target device, wireless power corresponding to the information on the amount of power required by the second target device via the at least one power transmitting element selected based on the ID information of the second target device.

7. The wireless power transmitting apparatus of claim 1, wherein the ID information corresponds to location information of the plurality of power transmitting elements.

8. The wireless power transmitting apparatus of claim 7, wherein the location information indicates a location corresponding to at least one of power transmitting element among the plurality of power transmitting elements.

9. The wireless power transmitting apparatus of claim 1, wherein the controller further configured to stop supplying power to the plurality of power transmitting elements except to the selected at least one transmitting element, in response to the at least one transmitting element selected based on the ID information of the first target device.

10. A wireless power transmitting method performed by an electronic device, the method comprising:

detecting a first target device configured to receive wireless power;

receiving information on an amount of power required by the first target device and identification (ID) information of the first target device from the first target device;

selecting at least one power transmitting element from among a plurality of power transmitting elements of the electronic device, based on the ID information of the first target device; and transmitting, to the first target device, wireless power corresponding to the information on the amount of power required by the first target device via the selected at least one power transmitting element.

11. The wireless power transmitting method of claim 10, further comprising transmitting, to a second target device, wireless power via at least one power transmitting element selected from among the plurality of power transmitting elements based on ID information of the second target device.

12. The wireless power transmitting method of claim 11, wherein the at least one power transmitting element selected based on the ID information of the first target device and the at least one power transmitting element selected based on the ID information of the second target device are arranged in an array.

13. The wireless power transmitting method of claim 11, an amount of power transmitted by the at least one power transmitting element selected based on the ID information of the first target device is different from an amount of power transmitted by the at least one power transmitting element selected based on the ID information of the second target device.

14. The wireless power transmitting method of claim 11, wherein a frequency of wireless power by the at least one power transmitting element selected based on the ID information of the first target device is different from a frequency of wireless power by the at least one power transmitting element selected based on the ID information of the second target device.

15. The wireless power transmitting method of claim 10, further comprising:

detecting a second target device configured to receive wireless power, receiving information on an amount of power required by the second target device and ID information of the second target device from the second target device, selecting at least one power transmitting element from among the plurality of power transmitting elements, based on the ID information of the second target device, and transmitting, to the second target device, wireless power corresponding to the information on the amount of power required by the second target device via the at least one power transmitting element selected based on the ID information of the second target device.

16. The wireless power transmitting method of claim 10, wherein the ID information corresponds to the location information of the plurality of power transmitting elements.

17. The wireless power transmitting method of claim 16, wherein the location information indicates a location corresponding to at least one of power transmitting element among the plurality of power transmitting elements.

18. The wireless power transmitting method of claim 10, further comprising stopping supplying power to the plurality of power transmitting elements except to the selected at least one power transmitting element, in response to the at least one power transmitting element selected based on the ID information of the first target device.

19. A non-transitory computer-readable storage medium storing instructions, which when executed by a processor, cause the processor to implement the method of claim 10.

* * * * *